United States Patent
Gibbel

(10) Patent No.: US 8,241,432 B2
(45) Date of Patent: Aug. 14, 2012

(54) SOLAR WAFER CLEANING SYSTEMS, APPARATUS AND METHODS

(75) Inventor: David S. Gibbel, Falls City, OR (US)

(73) Assignee: MEI, LLC, Albany, OR (US)

( * ) Notice: Subject to any disclaimer, the term of this patent is extended or adjusted under 35 U.S.C. 154(b) by 814 days.

(21) Appl. No.: 12/242,516

(22) Filed: Sep. 30, 2008

(65) Prior Publication Data

US 2009/0223539 A1 Sep. 10, 2009

Related U.S. Application Data

(60) Provisional application No. 61/034,871, filed on Mar. 7, 2008.

(51) Int. Cl.
*B08B 3/02* (2006.01)
(52) U.S. Cl. .................. 134/25.1; 134/32; 134/34
(58) Field of Classification Search .................. None
See application file for complete search history.

(56) References Cited

U.S. PATENT DOCUMENTS

| | | | | |
|---|---|---|---|---|
| 6,139,591 | A | * 10/2000 | Nakaura et al. | 29/25.01 |
| 2008/0202551 | A1* | 8/2008 | Joo | 134/1.3 |
| 2008/0233720 | A1* | 9/2008 | Carberry | 438/492 |
| 2008/0308125 | A1* | 12/2008 | Stangl et al. | 134/10 |

FOREIGN PATENT DOCUMENTS

WO WO/2007/065665 * 6/2007

\* cited by examiner

*Primary Examiner* — Michael Kornakov
*Assistant Examiner* — Ryan Coleman
(74) *Attorney, Agent, or Firm* — Klarquist Sparkman, LLP

(57) ABSTRACT

Solar wafer clean systems, methods and apparatus capable of receiving wafer combs that have been treated with a wire-saw cutting device and providing final clean solar wafers while the wafers are on the beam (before or without any pre-cleaning) are disclosed. Embodiments of methods and apparatus produce clean solar wafers while attached to the beam without the need for a pre-clean step or tool. As such certain of the embodiments provide efficient and cost-effective cleaning of solar wafers on the beam that is also economically viable on a commercial scale.

14 Claims, 19 Drawing Sheets

SIDE VIEW

SOLAR WAFER CLEANING SYSTEMS, APPARATUS AND METHODS

CROSS REFERENCE TO RELATED APPLICATION

This application claims the benefit of U.S. Provisional Application No. 61/034,871, filed Mar. 7, 2008, which is incorporated herein by reference in its entirety.

FIELD

This disclosure pertains to systems, methods and apparatus for cleaning solar wafers.

BACKGROUND

Solar wafers, such as those used to produce photovoltaic devices, are typically cut from semiconductor ingots using wire-saw devices. Wire-saw devices are generally preferred for wafer cutting because they are capable of cutting thin wafers with low material losses, high quality cut surfaces, and high yield compared to some other wafer cutting methods. Typical wire-saw devices slice an ingot into wafers using a web of thin wires contacted with an abrasive slurry, producing wafers that are contaminated with slurry and fine silicon dust. Therefore, before the wafers can be further processed or distributed to solar wafer processors the wafer surfaces must be cleaned.

Current solar wafer cleaning apparatus and methods are slow, inefficient, and costly, requiring several machines or process steps. Therefore, there is a need for improved solar wafer cleaning apparatus and methods

SUMMARY

Disclosed are systems, methods and apparatus for cleaning solar wafers while the solar wafers remain attached to a beam thereby forming a solar-wafer comb. Due to the viscous and often hydrophobic nature of wire-saw cutting slurries used to cut or slice solar wafers, the small dimensions of interstitial regions between the cut solar wafers while attached to the beam, in which such interstitial regions slurry and silicon particulates are trapped, and due to the extreme fragility of solar wafers, solar wafers and especially solar wafer combs are difficult to clean. Methods and apparatus have been developed for cleaning integrated circuit wafer combs (i.e., wafer combs comprising wafers used to make integrated circuits) but because solar wafers are significantly more fragile than IC wafers, current methods and apparatus suitable for IC wafers are not suitable for solar wafers. Accordingly, as disclosed herein, systems, methods and apparatus have been invented to efficiently and effectively provide final clean solar wafers wherein such cleaning takes place with the solar wafers remaining attached to the beam.

One embodiment of the disclosed solar wafer cleaning method comprises providing final clean solar wafers by receiving a solar wafer comb having a plurality of solar wafers attached to a beam, submerging the solar wafer comb in a fluid bath, and sequentially expanding interstitial regions of the solar wafer comb thereby providing the final clean solar wafers while on the beam.

The above described method may further comprise generating a plurality of spaced apart streams of fluid to be received by and perpendicular to a side of the solar wafer comb.

The above described method may also further comprise moving the plurality of spaced apart streams of fluid along the side of the solar wafer comb.

The above described method may also further comprise increasing wafer separations for a first group of wafers and decreasing wafer separations for a second group of wafers immediately adjacent the first group.

The above described method may also further comprise detaching the solar wafers from the beam after the solar wafers are clean. The above described method may also include a step wherein the solar wafer comb is pre-cleaned prior to submerging the solar wafer comb. The above described method may also include a step wherein 80% or more of the clean solar wafers exhibit no visible wafer damage.

The above described method may also further comprise producing a solar cell or a photovoltaic device using one or more of the cleaned solar wafers.

The above described method may also further comprise producing the solar wafer comb by cutting an ingot, mounted to the beam, using a wire-saw device.

The above described method may also include a step wherein one or more of the solar wafers have thicknesses of 225 microns or less. Or the above described method may also include a step wherein one or more of the solar wafers have thicknesses of 150 microns or less.

Another embodiment of the disclosed solar wafer cleaning method comprises submerging in a fluid bath a central solar wafer and a first and a second solar wafer both immediately adjacent the central solar wafer, wherein each wafer is adhered to a beam at respective a top edge as part of a solar wafer comb, flowing fluid between the central solar wafer and the first solar wafer to increase a separation between the surfaces of the central and the first solar wafer, removing slurry from the surfaces of the central and the first solar wafer using the flowing fluid, and adjusting a position of the flowing fluid to decrease the separation between the surfaces of the central and the first solar wafer and to increase a separation between the surfaces of the central and the second solar wafer.

The above described method may further comprise after the wafers have been cleaned using the flowing fluid, submerging the wafers in a fluid having an elevated temperature to detach the wafers from the beam.

The above described method may also include a step wherein the flowing fluid is moved along the solar wafer comb in a linear direction to flow fluid between immediately adjacent solar wafers as the flowing fluid is moved in a linear direction. Or the above described method may include a step wherein at least one of the solar wafers has a thickness of less than 200 microns.

Another embodiment of the disclosed solar wafer cleaning method comprises generating a fluid pattern in a fluid bath used for cleaning solar wafers of a solar wafer comb while the solar wafers are connected to a beam by providing in the fluid bath a plurality of spaced apart jets capable of ejecting fluid flows, generating alternating regions of streamlined flow and turbulent flow using the jets, and adjusting a fluid velocity of one or more of the jets such that the fluid velocity of the jets is within a range of fluid velocities to clean the solar wafers of the solar wafer comb without causing visible damage to greater than 10% of the solar wafers.

The above described method may further comprise submerging the solar wafer comb in the fluid bath such that the plurality of parallel, spaced apart jets of fluid are perpendicular to a longitudinal axis of the solar wafer comb.

The above described method may also include a step wherein the solar wafer comb comprises a plurality of solar wafers having thicknesses of less than 200 microns.

The above described method may further comprise using the regions of streamlined flow and turbulent flow to separate first groups of solar wafers of the solar wafer comb and to compress second groups of solar wafers of the solar wafer comb.

The above described method may further comprise adjusting a relative position of the jets of fluid and the solar wafer comb to compress the first groups of solar wafers and to separate the second groups of solar wafers.

The above described method may also include a step wherein the suitable range of fluid velocities consists of the fluid velocities being between 0.2 feet per second and 16 feet per second.

The above described method may also include a step wherein the suitable range of fluid velocities consists of the fluid velocities being between 2 feet per second and 14 feet per second.

Another embodiment of the disclosed solar wafer cleaning method comprises positioning a solar wafer comb including a plurality of solar wafers connected to a beam, along a side of a discharge manifold within a processing tank, filling the processing tank with a first fluid until the first fluid has covered the solar wafers of the solar wafer comb, discharging a second fluid using several nozzles positioned along the side of the discharge manifold at a predetermined fluid velocity, moving the discharge manifold perpendicular to a direction of fluid discharge from the nozzles so as to clean the solar wafers, and contacting the solar wafer comb with a fluid at an elevated temperature until the solar wafers detach from the beam.

The above described method may also include a step wherein the second fluid comprises recirculated first fluid.

The above described method wherein the cleaning of the solar wafer comb is conducted such that less than 10% of the solar wafers are damaged.

The above described method may further comprise manufacturing a solar cell or photovoltaic device using one or more cleaned solar wafers of the cleaned solar wafer comb after the cleaned solar wafers have been detached from the beam.

The above described method may also include a step wherein the solar wafer comb comprises a plurality of solar wafers having a thickness of less than 225 microns.

An embodiment of the disclosed solar wafer cleaning system may comprise providing one or more computer-readable media storing a sequence of computer-executable instructions that when executed by a processor of a solar wafer cleaning apparatus cause the apparatus to perform a solar wafer cleaning process including filling a processing tank with a first fluid until a fluid level is sufficiently high to submerge a discharge manifold positioned within the processing tank, pumping a second fluid into the discharge manifold so that nozzles positioned along a side of the discharge manifold are pressurized to a predetermined nozzle pressure, and moving the discharge manifold within the tank so that solar wafers on a solar wafer comb to be positioned within the tank would be cleaned while attached to a beam without damaging greater than 30% of the solar wafers.

The above described method may further comprise draining a portion of the fluid contained in the processing tank and pumping the portion of the fluid into the discharge manifold to recirculate fluid within the apparatus.

The above described method may further comprise adjusting the predetermined nozzle pressure by changing an angular velocity of a pump performing the pumping.

The above described method may further comprise receiving from a pressure transducer information that corresponds to an instantaneous nozzle pressure and adjusting an angular velocity of a pump performing the pumping based on the received information.

Another embodiment of the disclosed process for cleaning a solar wafer comprises providing a plurality of solar wafers attached to a beam so as to form a solar wafer comb; and cleaning the solar wafer comb to provide final clean solar wafers attached to the beam in less than 1, 1.3, 1.5 or 2 hours without causing visible damage to greater than 20% of the solar wafers.

One embodiment of the disclosed solar wafer cleaning apparatus comprises a device designed to receive and hold a solar wafer comb having a plurality of solar wafers with a first pair of solar wafers attached at respective first top edges to a first pair of beam tabs connected to a beam, having first surfaces contacted with residual slurry from a wire-saw device, and positioned to be separated at the respective first top edges by a first distance that is less than a saw kerf associated with the wire-saw device and such that the solar wafers are in contact at respective first bottom edges and a second pair of solar wafers attached at respective second top edges to a second pair of beam tabs connected to the beam, having respective second surfaces contacted with residual slurry from the wire-saw device, and positioned to have a first separation between the respective second top edges and a second separation between respective second bottom edges, wherein the first and the second separations are greater than the saw kerf, and a first and a second nozzle configured to generate a first and a second stream of fluid, respectively, and separated by a nozzle separation distance that is greater than a separation between the first pair of beam tabs and the second pair of beam tabs, wherein the device is configured such that the first pair of solar wafers is positioned between the first and the second streams of fluid and the second pair of solar wafers is positioned within the first stream of fluid.

The above described apparatus may further comprise the second separation being between 2 and 5 times the saw kerf.

The above described apparatus may further comprise the device configured to have the first pair of wafers being positioned at a location that is 25% of the nozzle separation distance from the first stream of fluid.

The above described apparatus may further comprise the first and the second nozzle configured to generate the first and the second stream of fluid to have fluid velocities sufficient to remove at least a portion of residual slurry on the surfaces of the second pair of solar wafers without causing visible damage to the second pair of solar wafers.

The above described apparatus may further comprise the a processing tank, wherein the apparatus is configured to position the first pair of solar wafers, the second pair of solar wafers, and the first and the second nozzle within the tank and submerged in a fluid.

Another embodiment of the disclosed solar wafer cleaning apparatus comprises a device configured to receive and hold a solar wafer comb having a plurality of solar wafers attached to a beam, and fluid flow jets spaced out along a side of the solar wafer comb at positions sufficient to eject fluid flows capable of expanding several groups of the solar wafers while compressing several groups of solar wafers adjacent to the groups of expanded solar wafers such that the solar wafers are cleaned without causing visible damage to more than 10% of the solar wafers.

The above described apparatus may further comprise a container for holding a first fluid wherein the container is sized and configured to receive the solar wafer comb and fully submerge the solar wafer comb in the first fluid.

The above described apparatus may further comprise the fluid flow jets comprising high-volume, low-pressure nozzles. The above described apparatus may further comprise the solar wafer comb comprising one or more solar wafers having thicknesses of less than 225 microns.

The above described apparatus wherein the device receives and holds a solar wafer comb characterized by a kerf width, and groups of expanded wafers comprising at least one pair of solar wafers immediately adjacent one another and that are separated by a distance that is greater than the kerf width.

The above described apparatus may comprise a device capable of receiving a solar wafer comb wherein the distance is between 2 and 5 times the kerf width.

Another embodiment of the disclosed solar wafer cleaning apparatus may comprise a holding tool configured to hold a solar wafer comb comprising a plurality of solar wafers attached to a beam, and one or more nozzles configured to produce one or more streams of fluid having sufficient energy to remove visible slurry and/or silicon dust from the surfaces of the solar wafers while the solar wafers are on the beam in less than 1, 1.3, 1.5 or 2 hours without visibly damaging more than 25% of the solar wafers to provide final clean solar wafers attached to the beam.

The above described apparatus may further comprise one or more of the plurality of solar wafers having thicknesses of less than 225 microns. Or the above described apparatus wherein less than 10% of the solar wafers are visibly damaged when finally cleaned by the apparatus.

The above described apparatus may further comprise the plurality of solar wafers comprising polycrystalline silicon.

The above described apparatus may further comprise the holding tool being configured to hold the solar wafer comb in a wafers down orientation.

The above described apparatus may further comprise the one or more nozzles being high-volume, low-pressure nozzles.

The above described apparatus may further comprise the one or more streams of fluid having sufficient energy to provide interstitial cleaning of the solar wafers while on the beam without visibly damaging greater than 15% of the solar wafers.

The above described apparatus may further comprise the one or more nozzles capable of pre-cleaning the solar wafers prior to final clean of the solar wafers.

The above described apparatus may further comprise the one or more streams of fluid having sufficient energy to remove visible slurry and/or silicon dust from the surfaces of the solar wafers while the solar wafers are on the beam and without causing visible damage to greater than 5% of the solar wafers.

Another embodiment of the disclosed solar wafer cleaning apparatus may comprise means for receiving a solar wafer comb, means for submerging the solar wafer comb in a fluid bath, and means for sequentially expanding interstitial regions of the solar wafer comb to clean the solar wafer comb while the solar wafers are attached to the beam without damaging greater than 50% of the solar wafers.

The foregoing and other objects, features, and advantages will become more apparent from the following detailed description, which proceeds with reference to the accompanying figures.

DETAILED DESCRIPTION

Figure 1:
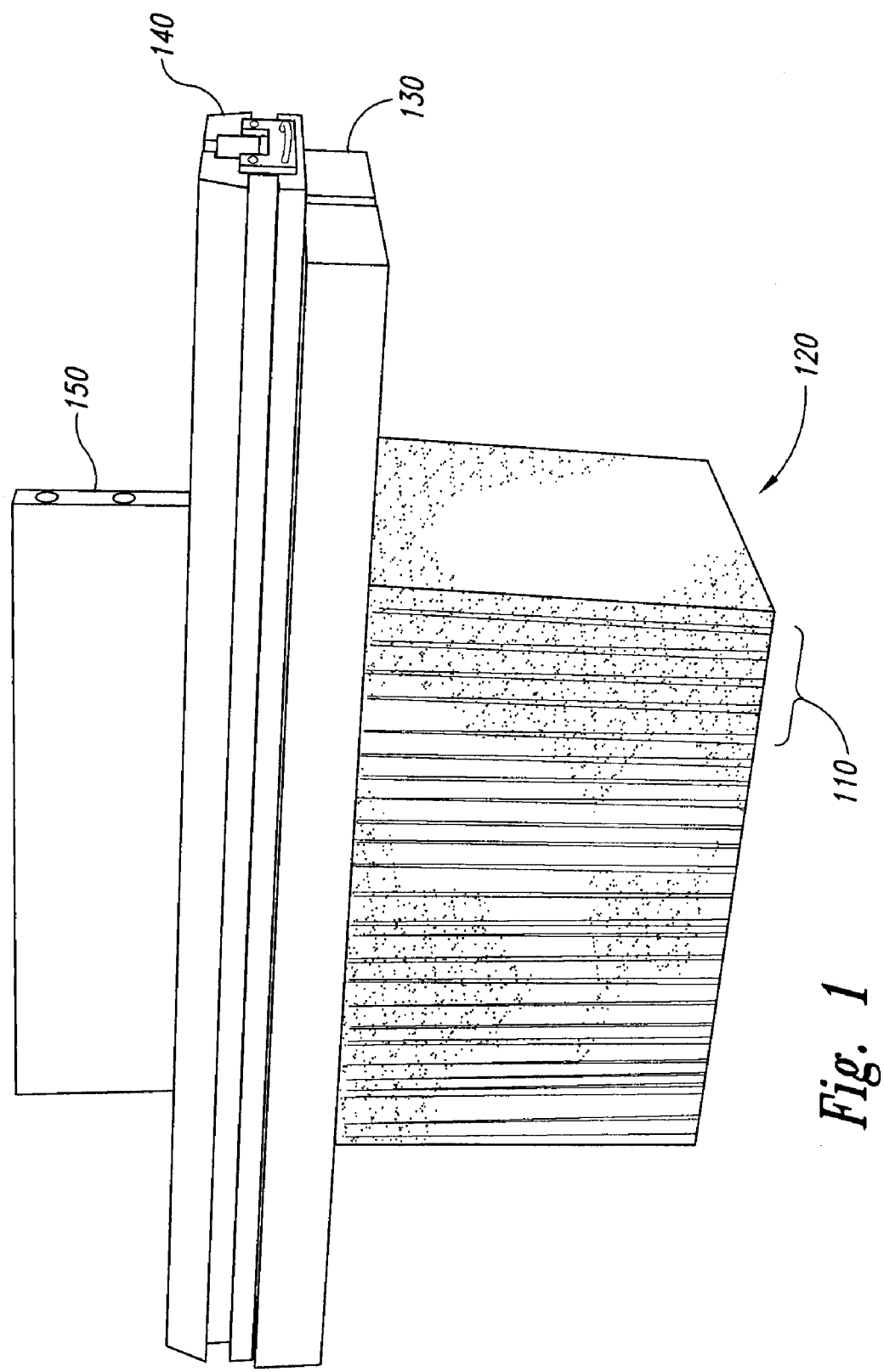
FIG. 1 is an side-view of a wire-sawn ingot attached to a beam and a wire-saw tooling component.

This disclosure is set forth in the context of multiple representative embodiments that are not intended to be limiting in any way. The present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular sequential order for convenient presentation, it should be understood that this manner of description encompasses rearrangement, unless a particular ordering is disclosed by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed invention. These terms are high-level abstractions of the actual operations that are performed. The actual operations that correspond to these terms will vary depending on the particular implementation and are readily discernible by one of ordinary skill in the art with a reading of this disclosure.

Theories of operation, scientific principles, or other theoretical descriptions presented herein in reference to the apparatus or methods of this disclosure have been provided for the purposes of better understanding and are not intended to be limiting in scope and in some instances represent hypotheses. The apparatus and methods in the appended claims are not limited to those apparatus and methods which function according to scientific principles or theoretical descriptions presented herein.

As used in this application and in the claims, the singular forms "a," "an," and "the" include the plural forms unless the context clearly dictates otherwise. Additionally, the term "includes" means "comprises." Further, the terms "coupled" and "connected" mean electrically, electromagnetically, or mechanically coupled or linked and do not exclude the presence of intermediate elements between the connected items unless otherwise noted in the disclosure thereof or clearly and unambiguously necessary for the disclosed operation thereof.

Unless otherwise stated, all numbers and ranges presented in this application are approximate—within the scientific uncertainty values for the tests required to determine such number values and ranges, as known to those of ordinary skill in the art. Furthermore, terms such as "constant" and "equal" refer to situations that are substantially constant and substantially equal, respectively. Terms such as "perpendicular" and "parallel" are sometimes used in this application to refer to relative locations or orientations of a component or element, or of a motion or action. These terms refer to substantially perpendicular and substantially parallel situations, respectively unless otherwise disclosed.

Semiconductor wafers are used as substrates in the manufacture of integrated circuits and related devices; such wafers can be referred to as "integrated circuit wafers" or "IC wafers." Semiconductor solar wafers are used in the manufacture of solar photovoltaic cells and related devices (referred to as "solar wafers"). Although IC and solar wafers can be produced using similar techniques (e.g., cutting semiconductor ingots using a wire-saw device), solar wafers are much thinner, and may be formed from different materials than are IC wafers and hence solar wafers are significantly more fragile than are IC wafers. The thinness and fragility of solar wafers present a unique challenge to the wafer cleaning industry.

Semiconductor IC and solar wafers are both generally single slices cut from an ingot comprising a semiconductor material. A semiconductor ingot is a solid mass or block of a semiconductor material (e.g., silicon) that has been grown (formed) in accordance with conventional techniques to be cut into wafers. Most wafers are sliced from silicon ingots, though other semiconductor materials may be used. An ingot can be comprised of a monocrystalline or polycrystalline material, and the material may be doped. An ingot is generally longer than it is wide, and a cross-section of the ingot can be circular, square, rectangular, square or rectangular having radiused corners, or pseudo-square (e.g., wherein corners are circular), for example. Typically, an ingot is between 100 mm and 3000 mm long, such as between 450 and 850 mm in length, or between 500 and 550 mm in length. However, ingots can be longer than 3000 mm, or shorter than 100 mm. Exemplary ingots are 100 mm, 500 mm, 550 mm, and 800 mm long. Ingots are typically between 60 mm and 800 mm in width with other sizes also possible. Exemplary ingots are shaped to be 150 mm (6 inches), 200 mm (8 inches), 300 mm (12 inches), or 450 mm (18 inches) in diameter (if circular in cross-section) or in width (if square or rectangular in cross-section).

In general, a wafer is characterized by two surfaces that can be circular, square, rectangular, square or rectangular with radiused corners, or pseudo-square, for example, and a thickness that is the distance between the two surfaces. A wafer shape and material composition depend on the ingot from which it is cut, and the wafer thickness is determined during the wafer cutting process. The wafer thickness, surface dimensions, and the material composition (sometimes referred to as the wafer "type") are generally chosen based on the intended use for the wafer, such as, for use as a substrate for an integrated circuit device (i.e., an IC wafer) or as a substrate for a photovoltaic device (i.e., a solar wafer). Exemplary wafers can have surface sizes that are 150 mm, 200 mm, 300 mm, or 450 mm in diameter (if circularly shaped) or in width (if square or rectangular shaped), although other dimensions are possible. In some examples, solar wafers are 156 mm square or 152.4 mm square.

As stated above, wire-saw devices are generally preferred for wafer cutting because they are capable of quickly cutting high-quality cut surface, thin wafers since all wafers are cut simultaneously as opposed to sequentially, as was formerly done with conventional wafer cutting devices. A wire-saw device is a device that uses several strands, e.g., a single wire taken from a spool and routed through a set of wire guides, of thin wire contacted with an abrasive slurry to cut an ingot into a plurality of wafers. The abrasive slurry comprises hard, abrasive particles and a carrier agent such as an oil or glycol-based solution. The current trend is use of water-soluble based slurries and away from oil-based slurries.

Before the ingot is cut into wafers, it is typically mounted to a beam, which facilitates cutting of the ingot by the wafer-saw device and handling of the wire-sawn ingot. The ingot is mounted to the beam using an adhesive. The adhesive may be a variety of different compounds capable of bonding the ingot to the beam and maintaining that bond while the ingot is cut by the wire-saw device. It is advantageous that the adhesive be removable, and an adhesive such as epoxy is often used. In one example, a 1 mm thick layer of epoxy was used to bond a 500 mm ingot to a beam; however, other types of adhesives and thicknesses of the same may be used as is known to those skilled in the art.

A beam is a workpiece typically composed of glass, graphite, carbon, filled-epoxy, or other material sufficiently rigid to hold an ingot during the cutting process. The beam is typically rectangular in shape and serves as an intermediate holding tool or component between the ingot and a device that receives and handles the ingot in the saw-cutting apparatus. The beam can be fixed or mounted to an additional adapter tool such as a wire-saw tooling component. For example, the beam can be mounted to a wire-saw dovetail, which is a tooling component that is cut with a sliding dovetail joint that is compatible with a wire-saw device. The entire assembly including the ingot mounted to the beam, or the ingot mounted to the beam and attached to the adapter tool, is received by the wire-saw device. The adapter tool can be used to facilitate handling and attaching of the wire-sawn ingot and beam to devices other than the wire-saw device.

FIG. 1 illustrates a wire-sawn ingot 120 (also referred to as a "wafer comb") attached to a beam 130 and to an adapter tool 140. When the beam with the cut wafers are removed from the wire-saw device, the wafers are drawn together with adjacent wafers into dirty clumps of wafers 110. In this example the adapter tool 140 is attached to a holding tool 150 of a cutting device (not shown).

During the wafer cutting process, the wire-saw typically cuts through the entire width of the ingot in a direction toward the beam and also typically cuts partially into the beam through the adhesive holding the ingot to the beam. The cut portions of the beam are referred to as "beam tabs." Although beam tabs need not always be formed during the ingot cutting process, current wire-saw devices do generally cut into the beam and form such tabs. Each beam tab is connected by a thin strip of adhesive holding a wafer. The beam tab length is typically between 0.25 mm and 10 mm, such as between 1 mm and 6 mm or between 1.5 mm and 4 mm. In an example, the beam tab length is 2.5 mm. The adhesive and beam tab are generally flexible, allowing the wafers to pivot or swing while attached to the beam. The regions between the beam tabs typically comprise significant amounts of residual slurry and/or silicon dust from the cutting process.

As used herein, a "wafer comb" (or "solar wafer comb") is one or more wire-sawn ingots mounted to a beam, wherein the one or more ingots are mounted to the beam prior to being sawn such that the ingot is cut into wafers while attached to the beam. A solar wafer comb comprises a plurality of wafers each attached or mounted at one edge (referred to as "the mounted edge") to the beam. The solar wafers of the wafer comb are mounted along a longitudinal axis of the beam such that wafers are perpendicular to the longitudinal axis. As stated above, because the wafers of the wafer comb are attached to the beam at a single edge by a flexible beam tab, the wafers are capable of pivoting thereabout. The wafers can be said to pivot about an axis that is perpendicular to the longitudinal axis of the beam. This axis can be referred to as the "pivot axis" and is typically located within the beam tab or the adhesive layer. The wafers can pivot about the pivot axis through a limited arc before the wafers will typically break free from the beam, perhaps about 30 to 40 degrees relative to the beam axis; however, such a degree of pivot is typically prevented by the adjacent wafers. Only the wafers at each end of the beam might pivot to such a degree as they are unrestricted in one direction.

A solar wafer comb comprises more than 100 wafers, and typically hundreds or thousands of wafers. For example, an ingot having a length of 500 mm or 800 mm that is mounted to a beam and cut by a wire-saw device generally produces a wafer comb comprising over a thousand wafers. A wafer comb can comprise fewer than 100 wafers, such as 10 wafers, though it is generally not economical on a commercial scale to produce wafer combs having so few wafers. A wafer comb can be produced from an ingot of any size or length, provided a wire-saw device is capable of cutting the ingot. A wafer comb can also be produced from two or more ingots mounted to a beam, such as two or more 100 mm ingots mounted end to end, with or without a slight gap in between.

The width of a wire-saw cut is referred to as the kerf width. The 'kerf' is referred to herein as the gap between cut wafers after cutting, and 'swarf' is the material removed from said gap. The kerf width is the distance between immediately adjacent beam tabs, or if the beam is not cut, then the kerf is the distance between immediately adjacent wafers at the top edge of the wafer comb—the edge where the wafer is connected to the adhesive. The kerf width can also be the distance between immediately adjacent wafers at any point along the surfaces of adjacent wafers of a wafer comb when the wafers are hanging strictly perpendicular (when the wafers are undisturbed by outside forces, by large amounts of slurry and/or silicon dust debris or when the wafer surfaces are not drawn together due to surface tensions, etc.). The kerf width is desirably as small as is physically possible to produce by a wire-saw device. The kerf width of a wafer comb produced using a wire-saw device employing wires that are 160 microns in diameter is typically 200 microns or 220 microns. The kerf width is typically between 50 and 400 microns. Usually the kerf width is between 100 and 300 microns, between 160 and 250 microns, or between 200 and 220 microns.

The solar wafers of a solar wafer comb are referred to as wafers that are "on the beam" because the solar wafers, having been cut from an ingot attached to the beam, remain attached to the beam. Methods and processes described herein that are performed on the beam refer to methods and processes that are performed while the solar wafers remain attached at one edge to the beam as a solar wafer comb. That is, the methods and processes are performed before the solar wafers of the solar wafer comb are detached from the beam. Systems and apparatus described herein that accept solar wafers on the beam are configured to accept solar wafers in the form of a solar wafer comb.

When a wafer comb is held in a "wafers down" orientation, the wafers of the wafer comb are hanging or suspended in a downward direction from the beam toward the ground such that the beam is directly above the solar wafers relative to the ground. In this position the beam is said to be parallel to the ground. When a wafer comb is in a solar wafers down orientation, the mounted edges are referred to as the top edges of the solar wafers and the free edges (unattached edges opposite the top edges) are referred to as the bottom edges. When the wafer comb 120 shown in FIG. 1 is mounted to the holding tool 150 such that the wafers of the wafer comb hang downward from the beam 130, and the beam is parallel to the ground, the holding tool 150 is holding the wafer comb 120 in a wafers down orientation.

The regions between immediately adjacent wafers of a wafer comb are referred to herein as interstitial regions. An interstitial region between a pair of wafers is defined as the region bounded by the respective surfaces of the pair of immediately adjacent wafers, the bottom free edge of the wafers, and the beam. For example, the interstitial region between a pair of wafers extends from the bottom free edge of the wafers to the end of the saw cut into the beam, or to the top of the beam tab or to the top edge of the wafer and the cut region of the adhesive. The width of the interstitial region between a pair of wafers is typically equal to the kerf width at the top of the beam tab. Because the wafers are able to pivot, the width of the interstitial region can vary along the height of the wafers. Therefore, the width of the interstitial region at the bottom free edge of the wafers may be greater than or less than the kerf or different from the width of the interstitial region at the top edge of immediately adjacent wafers. The surfaces of the wafers and the interstitial regions between various solar wafers of the wafer comb contain significant amounts of residual slurry and silicon dust after the cutting process and prior to cleaning.

A wafer comb produced using a wire-saw device contains significant residual slurry and silicon dust as a result of the sawing process and wafers need to be cleaned to remove these contaminants prior to subsequent processing steps to make a solar wafer device. Slurry and silicon dust become trapped between the beam tabs or cut portions of the adhesive of the wafer comb. These trapped particles and slurry can drain or fall out and contaminate clean wafer surfaces. Therefore, the interstitial regions, including the regions between the beam tabs (and/or cut adhesive portions) and the wafer surfaces should also be cleaned to produce a clean solar wafer comb.

To clean the interstitial regions and the solar wafer surfaces, the wafers need to be separated and cleaning fluid must be forced into the gaps therebetween. Because the distance between the wafers is so small, it is difficult to force fluid between the wafers to provide sufficient cleaning to the surfaces without damaging the solar wafers (especially in a uniform flow, which is useful in providing superior cleaning capabilities without significant amounts of wafer damage). Because the wafers may also be wet with slurry or water or both, surface tension forces cause immediately adjacent solar wafers to be drawn together, making the wafers resistant to separation. For this reason, some prior art methods removed the wafers from the solar wafer beam prior to final cleaning the solar wafer. While certain prior art methods left the wafers on the beam for cleaning, such methods required manual processes where operators rinse wafers on-the-beam with hand-held sprayers to spray from one wafer to the next by hand prior to detachment—prior to this disclosure no automated wafer cleaning processes cleaned wafers on the beam.

Additionally, the viscous and often hydrophobic nature of the slurry can make it difficult to remove from the wafer surfaces even if the wafers can be separated. Typical slurries are thicker and have a higher viscosity than water. Some slurries are similar to high-viscosity sludge. Viscosity is commonly understood as an indication of a relative resistance to flow. A typical slurry includes silicon carbide particles suspended in a polyetyhlene glycol solution such as PEG-200 comprising propriety additives. Although glycol is generally miscible with water, glycol-based slurries typically include additives that render them partially-hydrophobic in nature (while oil-based slurries are completely hydrophobic). As a result of the viscous and sometimes partially-hydrophobic nature of the slurries, fluid forced between the solar wafers to clean the wafer surfaces must also be moving at sufficient velocity to dislodge the slurry and/or silicon particles. Residual slurry is difficult to remove from wafer surfaces without using a cleaning process that is at least partially mechanically active.

Neither soaking the solar wafer comb in water nor gently cascading water over the solar wafer comb provides sufficient cleaning of the wafers for subsequent processing steps or use of the solar wafers in a photovoltaic cell or other such application. The soaking or cascading fluid methods do not spread the wafers apart such that the interstitial regions are cleaned nor do those methods provide fluid velocities capable of dislodging the slurry and/or silicon dust. Cleaning wafers through soaking typically requires at least 12 to 48 hours of soaking time for contaminants to begin settling out of the wafer comb. For this reason alone, the soaking method is economically undesirable for use on a commercial scale. It is currently understood that if silicon wafers are contacted with water for a long period of time (e.g., longer than 12 hours, and possibly longer than 10 hours or even 4 hours), compounds in the slurry react chemically with the water thereby producing stains on the wafer surfaces. Such stains are generally visible with the naked eye, difficult to remove, and, ultimately, undesirable—wafer staining often results in false "positives" when the solar wafers are run through subsequent tests used to ensure the wafers are without defects prior to further processing. Although merely soaking the wafer comb in a glycol-based solution may provide some cleaning of the solar wafer comb, a soaking time of at least 24 hours would be needed to sufficiently clean the solar wafers. Such a method of cleaning would be extremely slow, and therefore is not economically viable on a commercial scale (also such methods do not provide consistent reliable cleaning of the wafers). Furthermore, if soaking with water present, such methods are not only slow with unreliable cleans, the soaking methods may cause staining of the wafers.

To remove oil-based slurries from solar wafers it is typically necessary to use chemical solvents during the cleaning process. Due to the potential health hazards and waste disposal associated with using such solvents, most slurries use glycol-based solutions instead of oil-based solutions.

Due to the viscous and often hydrophobic nature of wire-cutting slurries and the small dimensions of the interstitial regions, solar wafer combs are difficult to clean. Methods and apparatus have been developed for cleaning IC wafer combs (i.e., wafer combs comprising IC wafers) but because solar wafers are significantly more fragile than IC wafers, current methods and apparatus suitable for IC wafers are not suitable for solar wafers.

The fragility of solar wafers as compared to IC wafers is due in large part to the fact that solar wafers are thinner than IC wafers; IC wafers are typically sliced to a thickness of between 500 and 850 microns while solar wafers have thicknesses of 300 microns or less and typically less than 200 microns. For example, IC wafers measuring 150 mm round are typically sliced to a thickness of 600 microns but 150 mm square solar wafers are typically sliced in thicknesses of 220 microns or 200 microns. Wafers of this size and thinness are difficult to handle without causing damage. With the current trend reducing solar wafer thickness even further, such as 100 microns or less or 125 microns or less, or even 75 microns or less, fragility has only increased. The surface size of solar wafers is rising to, for example, 200 mm, 300 mm, or 450 mm wide, which also increases the fragility of the solar wafers.

Solar wafers can also be more fragile than IC wafers because of their crystalline form. For example, solar wafers may be comprised of monocrystalline or polycrystalline materials. Polycrystalline solar wafers are especially prone to fracture and are in general much more fragile to handle than monocrystalline wafers.

As used herein, the term "solar wafers" refers to thin semiconductor wafers having thicknesses of less than 300 microns that are suitable for use in the manufacture of solar photovoltaic cells and related devices. For example, solar wafers typically have thicknesses of equal to or less than 300 microns, 220 microns, 200 microns, 180 microns, 150 microns, 125 microns, 100 microns, 75 microns, or 50 microns; solar wafers can have any thicknesses between 50 microns and 300 microns. The term solar wafer as used herein is not limited to wafers for use in the manufacture of solar photovoltaic cells but may be used in other applications.

As used herein, the term "IC wafers" refers to semiconductor wafers that are thicker than solar wafers. Typically, IC wafers have thicknesses greater than 500 microns. IC wafers are generally suitable for use in the manufacture of integrated circuits and related devices. IC wafers do not include solar wafers and are generally considered to be too thick to be used for photovoltaic applications. The term IC wafer as used herein is not limited to wafers used for the manufacture of integrated circuits.

These and other differences between IC wafers and solar wafers make solar wafers more prone to damage during the wafer cleaning process. As a result, conventional cleaning tools that may provide suitable cleaning for IC wafers can cause significant damage to a significant number of the solar wafers that are cleaned and/or produce solar wafers that are not reliably clean.

As used herein, wafer "damage" includes fractures, cracks, nicks, chips, scratches, stains and other breakage. Wafer damage includes readily visible damage, such as damage that can be ascertained without the need for specialized damage inspection devices. Such wafer damage is observable with the naked eye (e.g., by an operator or a technician) and is referred to as "visible damage." Visibly damaged solar wafers are usually unsuitable for use by solar device manufacturers.

Wafer damage also includes damage that is not easily visible with the naked eye. Such damage is referred to as "invisible damage"—damage only observable using specialized damage inspection devices. Exemplary damage inspection devices use ultrasound detection and/or optical metrology techniques to detect microscopic fractures, cracks, and chips. Wafers with invisible damage have a significantly higher probability of manifesting visible damage during later manufacturing process steps. For example, wafers with invisible damage are generally more likely to break during downstream processing than wafers without invisible damage. Wafer damage, whether visible or invisible, is generally undesirable.

A currently accepted method for cleaning IC wafers includes spraying the IC wafers using high pressure jets, usually while the IC wafers are suspended from the beam in air. Available IC wafer cleaning tools typically use high-pressure, low-volume (HPLV) spray jets operating at pressures between 40 and 100 psi. Such high pressures are necessary in order to generate fluid jets with sufficient velocity to remove the slurry and/or dust from the interstitial regions of the IC wafer comb. IC wafers are sufficiently robust to withstand such vigorous cleaning methods and can be cleaned in this manner without causing wafer damage due to the larger thickness values of IC wafers while solar wafers subjected to the same or similar cleaning techniques are considerably damaged and are not sufficiently cleaned. If an IC wafer tool were used to clean solar wafers the tool would damage 90% or more of the wafers in a solar ingot when operated under the conditions of the apparatus and methods disclosed herein (i.e., conditions determined appropriate to sufficiently clean the wafers on the beam). If pressures in the IC wafer cleaning tool are reduced, the IC tool will fail to clean the solar wafers while still damaging 60 to 70% of the wafers in a given ingot.

Current methods and apparatus for cleaning solar wafers, however, are generally slow, inefficient and costly, requiring several process steps and/or multiple cleaning tools, and/or providing insufficient cleaning of the solar wafers while on the beam. Alternatively, tedious, slow manual methods are used that result in higher yield loss, multiple steps, and still require subsequent etching or final cleaning. As such, the conventional methods and apparatus are not economically feasible on a large scale or a commercial manufacturing scale, even more so the manual methods. Current trends toward high-yield, high-throughput "lights-out" manufacturing cells practically rule out manual cleaning methods.

Many solar wafer cleaning tools are considered to be only "pre-wash" tools because they provide only a preliminary clean to a solar wafer comb. That is, the solar wafer comb is still visibly dirty, either with patches of residual slurry on the wafer surfaces, or residual greasy or waxy films (as a result of un-removed slurry additives), or with dusty films (as a result of adherent silicon fines), or various combinations of all of the preceding. Solar wafers cleaned with these pre-wash tools must be cleaned again by another machine in order to produce final clean wafers.

A "clean" solar wafer (a solar wafer that has been provided a "final clean") is a wafer that has been cleaned of slurry, silicon dust, and other contaminants such that no visible slurry, and/or particulates and/or films appear on the wafer surfaces. A clean solar wafer is sufficiently clean to be sold to a manufacturer, and is typically sufficiently clean to enter production. A solar wafer cleaning system, method or apparatus is one that is capable of providing a final clean to wafers.

Industry practice is to consider a clean wafer to be a wafer that, upon inspection with the unaided eye, has no visible films, or residual slurry or particulates, or discolorations indicating stains. In an alternative test for cleanliness a wafer is not clean or finally clean if the wafer has: [1] a waxy or greasy film that may be evidenced by wiping a section of the wafer with a clean cloth or scraping with a fingernail, thus revealing a different sheen on the wafer surface as compared to an un-wiped area, or [2] a dusty film that may be evidenced by applying a piece of adhesive tape to the wafer, peeling off and sticking to a white surface (such as a sheet of paper), that then shows a grey contrast, or [3] obvious discoloration (usually dark), which indicates a stain (silicon is typically a uniform grey in color), or [4] dark marks or splotches of residual slurry, or [5] any surface contamination that may be transferred to a white cloth by wiping. Clean silicon solar wafers will not darken or contaminate a white cloth wiped across its' surface. Alternatively, for quantitative assessment of cleanliness of a solar wafer, tools such as SEM or rinsing solar wafer surfaces with DI water and using a particle analyzer to determine particulate count can be used. Such methods provide a quantitative value of particles per unit area. In addition, some surface cleanliness is determined using Surface Molecular Contamination methods as practiced by Balazs Analytical Services, a division of Air Liquide Electronics US, LP, located in Fremont Calif. Other methodologies, well known in industry, can be used to examine solar wafers for surface organic contamination, such as FTIR analysis.

Conventional or currently available solar wafer cleaning tools are only capable of providing a final clean to solar wafers after the wafers have been detached from the beam. Detaching the wafers from the beam prior to clean includes a number of disadvantages such as requiring extra wafer handling with associated breakage or wafer damage, larger footprint and more expensive tools because of additional multi-step processing, the requirement of a much larger physical space in a clean room environment to process the wafers. For example, one method currently used to clean solar wafers detached from the bean includes storing the separated wafers into cassettes that hold wafers on individual shelves separated by 3/16 of an inch, and typically hold about 50 wafers at the most. Thus, an ingot comb of 1000 wafers would require 20 cassettes for cleaning/additional processing. Large tools and ancillary equipment are needed to handle the cassettes, and the additional handling presents wafer damage and breakage problems, reducing throughput rates and yields while increasing capital costs. In some current systems, solar wafers are detached from the beam, placed in cassettes, and then soaked or sprayed clean. Wafers stored in cassettes can have gaps equivalent to 20 wafer-thicknesses or more between them and are therefore easier to clean than wafers on the beam. Other wafer cleaning tools utilize oscillating sprayers to clean detached wafers in cassettes, such as those employing a simple harmonic motion drive, which provide non-uniform and therefore insufficient cleaning. Still other cleaning tools clean the wafers when the wafers are "horizontal." That is, the solar wafers are detached from the beam and then placed on a horizontal surface before being cleaned.

Existing ultrasonic cleaners require solar wafers to be pre-cleaned, detached from the beam, and placed into cassettes before they can function properly. Ultrasonic cleaning methods are not capable of cleaning the wafer surfaces when the wafers are on the beam because the separation between the surfaces is so small. Therefore, solar wafers are pre-cleaned, usually by manually rinsing with a hand sprayer and then detached from the beam, separated from one another and placed into cassettes prior to being cleaned using standard ultrasonic cleaners.

To provide a clean solar wafer (a final clean solar wafer) using available methods and apparatus, multiple cleaning tools are used and the wafers must be removed from the beam. The additional steps and tools required by current methods of cleaning solar wafers add cost to the wafer cleaning process by necessitating multiple expensive tools, occupying large amounts of costly floor space in wafer production facilities, and ultimately slowing the cleaning process. Such methods and apparatus are expensive and inefficient.

As stated above, a solar wafer clean system, method and apparatus capable of receiving a wafer comb from a wire-saw device (before or without any pre-cleaning) and providing a clean solar wafer while the wafers are on the beam is disclosed herein even though those of ordinary skill in the art believe that cleaning solar wafers while on the beam is not possible due to the fragility of solar wafers. Disclosed embodiments of methods and apparatus are described herein that produce clean solar wafers (also referred to as "final clean") while on the beam, without the need for a pre-clean step or tool and without causing either visible damage and/or damage to greater than 5%, or 10%, or 15%, or 20%, or 25%, or 30%, or 50%, of the solar wafers cleaned using the disclosed embodiments of the solar wafer cleaning methods and apparatus. As such certain of the embodiments described herein provide efficient and cost-effective cleaning of solar wafers on the beam that is economically viable (or preferred) on a commercial scale. In addition, certain embodiments provide wafer detachment in the same setup/space/tooling/machine cycle. In certain embodiments the method endpoint provides clean detached wafers (optionally dry and optionally lightly etched) ready processing into solar cells Representative Embodiments An embodiment of a solar wafer cleaning apparatus comprises a holding tool configured to hold a solar wafer comb comprising a plurality of solar wafers attached to a beam, and one or more nozzles configured to produce one or more streams of fluid having sufficient energy to remove visible slurry and/or silicon dust from the surfaces of the solar wafers while the solar wafers are on the beam and without damaging a significant number of the solar wafers.

A second embodiment of a solar wafer comb cleaning apparatus comprises device capable of receiving a wafer comb and capable of producing in the solar wafer comb at least one group of expanded solar wafers and at least one group of compressed solar wafers adjacent to the group(s) of expanded solar wafers, and one or more flow regions spaced out within the cleaning apparatus so as to be positioned along a side of the wafer comb at positions that correspond to the group(s) of expanded solar wafers.

A third embodiment of a wafer cleaning apparatus includes a tank capable of receiving a solar wafer comb and a discharge manifold having several nozzles situated in the processing tank relative to the position where the solar wafer comb would be placed.

A fourth embodiment of a wafer cleaning apparatus comprises a holding tool configured to hold a solar wafer comb in a container such that the solar wafers of the wafer comb can be submerged in a fluid held within the container. The apparatus further comprises one or more nozzles positioned to be along a side of the wafer comb when the wafer comb is positioned in the container and configured to generate a stream of fluid to clean the submerged solar wafers.

Figure 2:
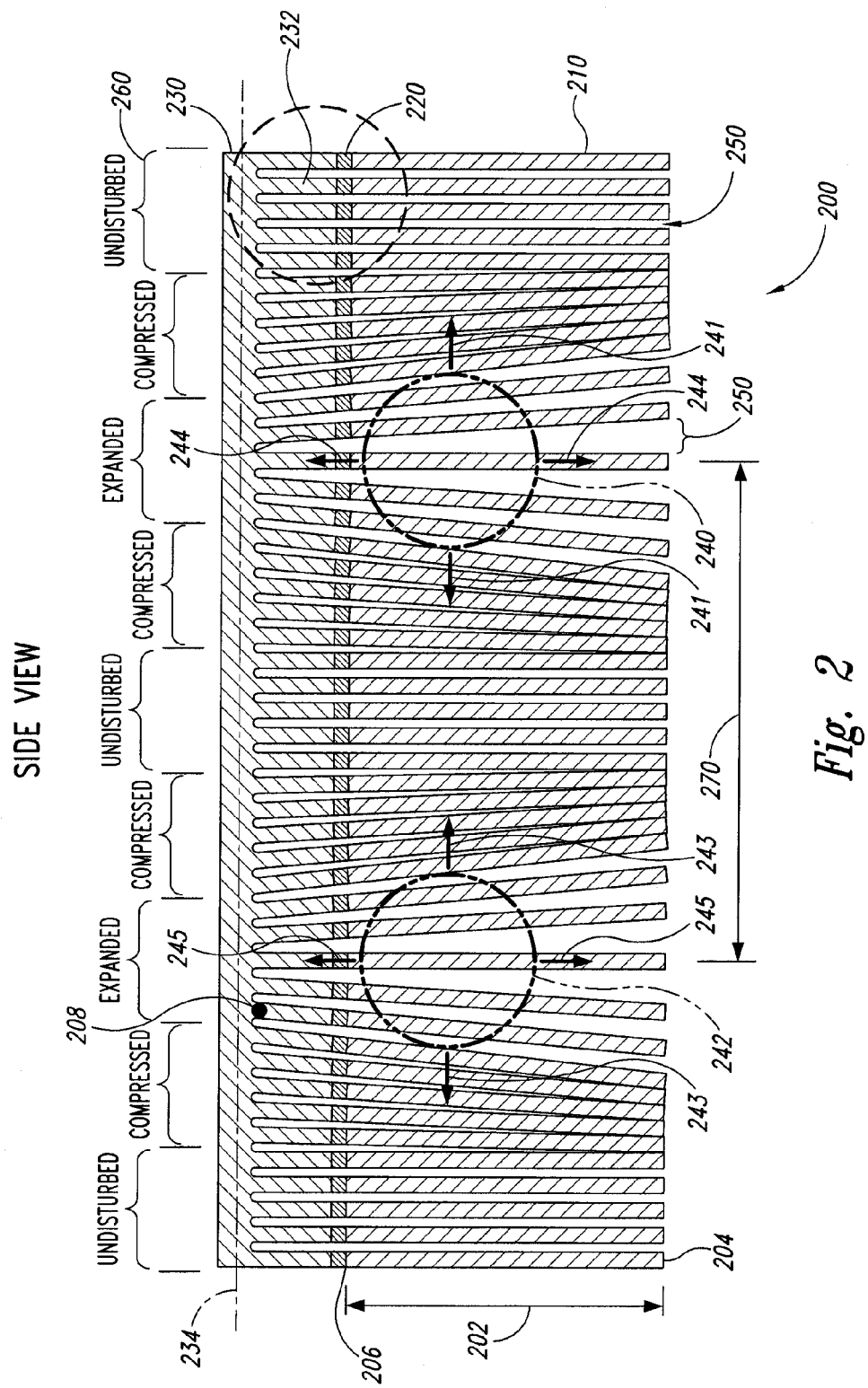
FIG. 2 is a side-view of a portion of a wafer comb illustrating regions of expanded and compressed wafers generated from flow regions positioned along the side of the wafer comb, the wafer comb being attached to a beam.

A side-view of a portion of an exemplary solar wafer comb 200 is illustrated in FIG. 2. The solar wafer comb 200 includes a plurality of solar wafers 210 connected to a beam 230 by an adhesive layer 220. The solar wafers 210 are shown attached to the beam 230 via beam tabs 232 and strips of the adhesive layer 220. The wafers 210 are mounted perpendicular to the longitudinal axis 234 of the beam 230. Between the solar wafers 210 of the wafer comb 200 are interstitial regions 250. Because the beam tabs 232 and the adhesive layer 220 are generally flexible, the solar wafers are capable of pivoting about a pivot axis 208. Therefore, the interstitial regions 250 can vary in size along the wafer comb as shown in FIG. 2.

The solar wafers 210 have mounted edges 206 and free edges 204, and the wafer height 202 is indicated. When the wafer comb 200 is positioned in a wafers down orientation (i.e., the beam is parallel to the ground), the mounted edges 206 are referred to as the top edges of the wafers 210 and the free edges 204 are referred to as the bottom edges of the wafers 210.

Figure 3:
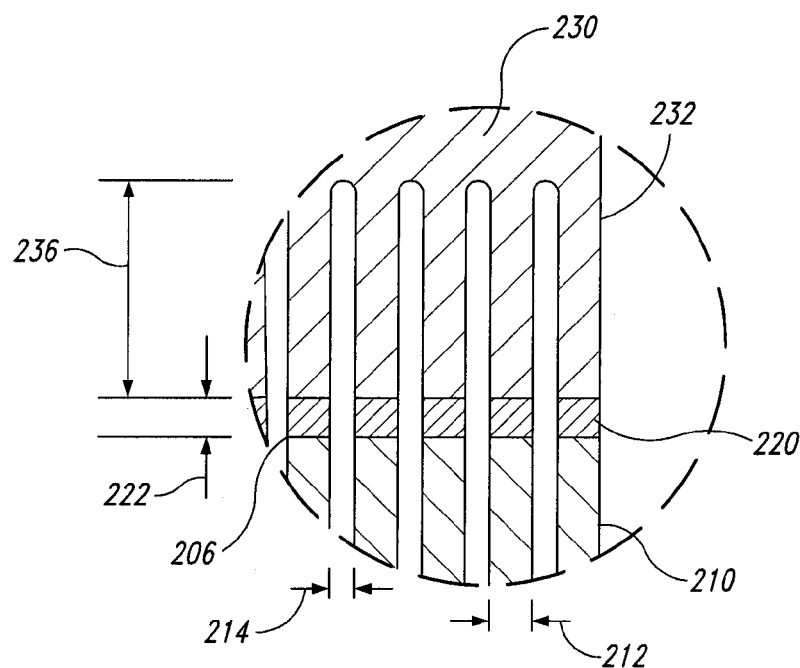
FIG. 3 is a magnified view of the mounted edges of a group of wafers of the wafer comb illustrated in FIG. 2.

FIG. 3 is a close-up of a portion of the solar wafer comb 200. The beam tabs 232, having lengths 236, are separated by a kerf distance 214. As shown in the close-up, the solar wafers 210 having thicknesses 212 are connected to the beam 230 via beam tabs 232 and strips of the adhesive layer 220 having a thickness 222. When the solar wafers 210 are undisturbed, the solar wafers 210 can also be separated by the kerf distance 214. However, as shown in FIG. 2, solar wafers that become expanded or compressed by pivoting about a pivot axis 208 are separated by distances that vary along the solar wafer height 202. The distances between adjacent solar wafer surfaces of the expanded and compressed solar wafers are typically greater and less than the kerf distance 214, respectively.

Figure 4:
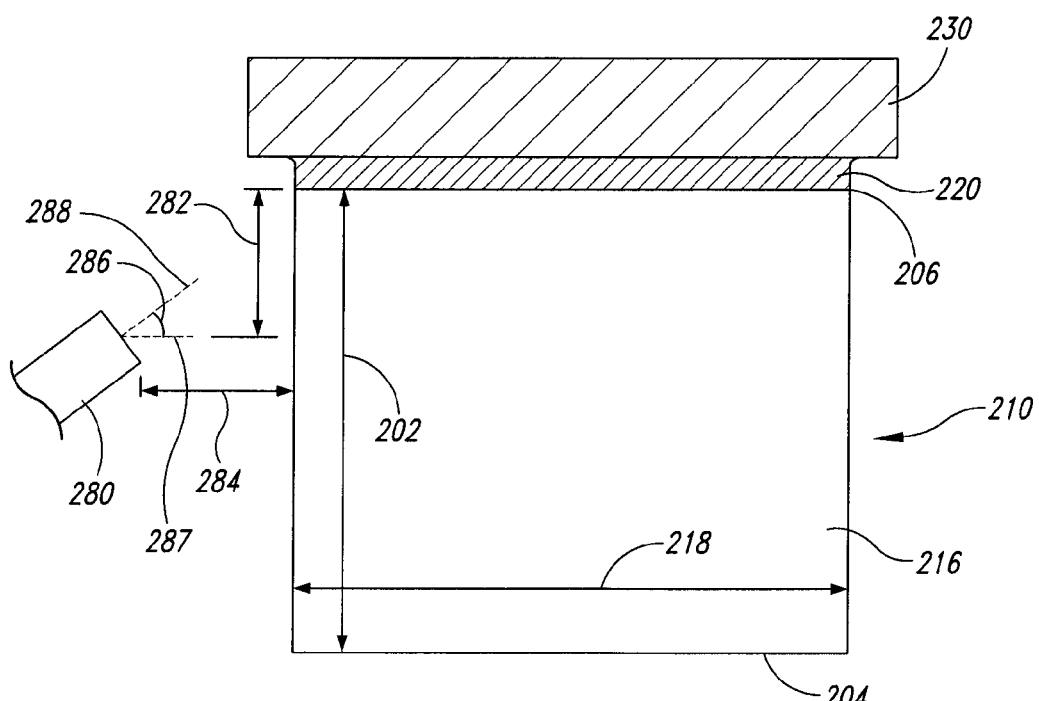
FIG. 4 is an end-view of a wafer comb and a nozzle situated relative to the wafer comb and directed at the side of the wafer comb.

FIG. 4 is an end-view of the solar wafer comb 200 illustrated in FIG. 2 and a nozzle 280 situated relative to the solar wafer comb 200 and directed at a side of the solar wafer comb 200. The solar wafers 210 are connected to the beam 230 by an adhesive layer 220 at the mounted edge 206. The solar wafer surface 216, wafer width 218, and wafer height 202 are indicated. The wafer comb 200 is positioned relative to the nozzle 280 and this relative position is designated by a nozzle vertical displacement 282 and a nozzle horizontal displacement 284. Further, the nozzle orientation is designated by an angle 286.

It should be noted that the illustrations of the solar wafer comb 200 shown in FIGS. 2-4 are intended to clarify particular features of an exemplary wafer comb. The features of the wafer comb 200 are not necessarily drawn to scale; therefore, the dimensions, relative sizes, distances, and distance ratios should not be considered as limiting in any way or as representative of all solar wafer combs.

Embodiments described herein can include a holding tool for holding the wafer comb. The beam of the wafer comb can be mounted directly to the holding tool, or the beam can be mounted to one or more intermediate tooling components, at least one of which is then coupled to the holding tool. Exemplary intermediate tooling components include adapter tooling and some wire-saw device tooling components. For example, the beam of the wafer comb can be mounted to a wire-saw dovetail tool, which is then attached to the holding tool by a dovetail sliding joint. Typically, the beam of the wafer comb is temporarily attached to the holding tool.

The holding tool is configured to hold the wafer comb in a wafers down orientation and can be configured to hold the wafer comb in other orientations as well. Typically, the holding tool is configured to move the wafer comb horizontally, vertically, or both directions as needed to facilitate positioning of the wafer comb relative to other components of the wafer cleaning apparatus. For example, the holding tool can be configured to lower the mounted wafer comb into a tank and/or to position the mounted wafer comb relative to one or more nozzles or a discharge manifold.

Typically, the holding tool is connected to one or more mechanisms that enable horizontal motion, vertical motion, or both of the holding tool. For example, the holding tool can be connected to a lifting mechanism that allows the holding tool to move the wafer comb vertically. The lift mechanism can include a mast or rod connected to and induced into motion by an actuator. The mast or rod is in turn connected to the holding tool such the motion of the mast is translated into motion of the wafer comb. The actuator may be driven by a motor or it may be hydraulically, pneumatically or manually driven. In a specific example, the holding tool is connected to a mast that is driven by a ball-screw-type linear actuator. The holding tool and lifting mechanism can be connected to other wafer cleaning apparatus components as described herein.

In some embodiments, it can be advantageous to connect a lift mechanism of the holding tool to an encoder. In general, an encoder is a device that converts position information into an analog, digital, or optical signal. When used in connection with the lift mechanism of the holding tool, the encoder detects a position of the lifting mechanism that is indicative of the wafer comb position. The encoder can be electrically or optically coupled to a controller, and/or an actuator (e.g., the motor of the actuator) and configured to receive a signal transmitted by the encoder that is indicative of the wafer comb position, and to adjust the wafer comb position based on the received signal. An encoder typically includes a sensing component such as a phototransitor and photodiode, which produces a 'thru-beam' capable of detecting notches cut into an encoder bar. Alternatively a cadmium sulphide photocell and light of LED could be utilized (referred at times as an encoder sensor). An encoder can be used to remotely or automatically control the position of the wafer comb. For example, a SUNX sensor/encoder (model PM-T54P) may be used.

Embodiments described herein can include one or more fluid discharge devices. In this disclosure, fluid discharge devices are generally referred to as nozzles for convenience; however, the nozzles referred to herein can be any fluid discharge device that generates a stream of fluid in a desired manner, such as direction, size and velocity. Exemplary fluid discharge devices include tubes, spray jets, conventional nozzles, spray nozzles, and an orifice configured to discharge fluid. In one example, a nozzle is a hole in a plate, while in other examples a nozzle is a flow tube. Desirably, the nozzles are high-volume, low-pressure (HVLP) fluid discharge devices. Exemplary nozzles can have cross-sections of various shapes. For example, nozzles can be round, square, circular, oval, rectangular, or other shapes.

The nozzles are coupled at first ends to a source of fluid or to a fluid input. For example, the first ends of the nozzles can be connected to a chamber configured to contain the fluid. Second ends of the nozzles are situated relative to a wafer comb such that fluid discharged from the nozzles is received by the wafer comb. For example, the second ends are oriented or directed towards the wafer comb. One or more of the nozzles are positioned at either or both sides of the wafer comb. The nozzles can be configured to move horizontally, vertically, or both relative to the wafer comb.

In general, nozzles have an inner dimension (e.g., an inner diameter when circular) that is indicative of a size of fluid discharge at the second ends. Nozzles can have various inner diameters between 1/32 of an inch (0.8 mm) and 1.5 inches (38 mm). For example, nozzles can have diameters between 0.1 inches (2.5 mm) and 1 inch (25 mm), or between 0.2 inches (5 mm) and 0.8 inches (20 mm). Desirably, the nozzles have diameters between 0.3 inches (7.6 mm) and 0.45 inches (11 mm), such as between 0.34 inches (8.6 mm) and 0.39 inches (9.9 mm) or between 0.39 inches (9.9 mm) and 0.42 inches (11 mm). In some examples, the nozzles have inner diameters of 3/8 inches (9.5 mm), while nozzles have inner diameters of 0.37 inches (9.4 mm) in other examples. In general, nozzle size is determined based on factors such as a desired flow rate, which is based on wafer size and thickness, and slurry composition, for example. Desirably, all nozzles have the same diameter but it is not necessary.

In a representative embodiment, the nozzles are flow tubes with a large aspect ratio. The aspect ratio is defined as the tube length divided by the tube inner diameter. Nozzles having a large aspect ratio may be advantageous for generating streamlined flow and for generating low-pressure, high-volume streamline or laminar flow. Exemplary flow tubes have aspect ratios of between 2 and 8, such as between 3 and 7, or between 4 and 6. In some examples, the flow tubes have aspect ratios of 4.5 or 5. Exemplary flow tubes can have first and second ends that are each cut at the same or different angles. For example, the flow tubes can be cut such that a plane flush with the end surface is perpendicular to an axis through the center and parallel to the length of the tube. However, in some examples, an angle between a plane flush with the end surface and an axis through the center and parallel to the length of the tube is more or less than 90 degrees.

Nozzles described herein are positioned relative to a wafer comb such that fluid discharged from the nozzles is used to clean the wafer comb. Positions of the nozzles are measured relative to the wafer comb and are indicated by a vertical and a horizontal distance. The second ends of the nozzles are situated at vertical positions that are indicated as a percentage of the wafer height, and that are measured relative to the mounted edge of the wafers. For example, the vertical position of a single nozzle 280 is indicated in FIG. 4 relative to a solar wafer 210 by a distance 282. The relative vertical position 282 of a nozzle is measured relative to the center of the nozzle 280 as shown in FIG. 4.

Nozzles are located between a vertical position that is at the mounted edge of the wafer (i.e., 0% of the wafer height from the mounted edge of the wafer) and a vertical position that is 80% of the wafer height from the mounted edge. Desirably, the nozzles are located at a vertical position that is closer to the mounted edge than a vertical position that is 50% of the wafer height from the mounted edge. For example, nozzles can be located at vertical positions that are between 0% and 5%, between 5% and 10%, between 10% and 15%, between 15% and 20%, between 20% and 25%, between 25% and 30%, between 30% and 35%, between 35% and 40%, between 40% and 45%, and between 45% and 50% of the wafer height from the mounted edge of the wafers. While nozzles can be situated at vertical positions that are greater than 50% of the wafer height from the mounted edge (such as, even greater than 80% of the wafer height from the mounted edge), cleaning is generally less efficient. The vertical position of the nozzles can remain constant or the vertical position can vary or be adjusted during a cleaning process or otherwise.

The positions of the second ends of the nozzles are also indicated by horizontal distances measured relative to the wafer comb. For example, the horizontal position of a single nozzle 280 is indicated in FIG. 4 relative to a solar wafer 210 by a distance 284. The relative horizontal position 284 of a nozzle is measured relative to the edge of the nozzle 280 as shown in FIG. 4.

The horizontal position of the nozzles can be between 1/32 of an inch (0.8 mm) and 2 inches (51 mm) from the wafer comb. Typically, the horizontal position is between 1/8 of an inch (3.2 mm) and 1 inch (25 mm), such as between 1/4 of an inch (6.4 mm) and 3/4 of an inch (19 mm), or between 1/4 of an inch (6.4 mm) and 1/2 of an inch (13 mm) from the wafer comb. The horizontal distance is desirably between 0.3 inches (7.6 mm) and 0.35 inches (8.9 mm), between 0.35 inches (8.9 mm) and 0.4 inches (10 mm), or between 0.4 inches (10 mm) and 0.45 inches (11 mm). In some embodiments, the horizontal distance is 3/8 of an inch (9.5 mm). The horizontal position of the nozzles can remain constant or the horizontal position can be adjusted during the cleaning process or otherwise.

Desirably, the horizontal distance is such that the wafer edge is within the streamlined, non-turbulent portion of the fluid discharged from the nozzle. Furthermore, the horizontal distance is not so small that the nozzle has a tendency to collide with the wafers and cause damage, or that the nozzle exerts a significant suction force on the wafer comb.

The orientation of the nozzles relative to the wafer comb is indicated by the relative orientation of an axis collinear with the center of the nozzles and parallel to the length of the nozzles. Such an axis can be referred to as the "nozzle axis" and is indicated as axis 288 in FIG. 4. Desirably, the nozzles are oriented such that the nozzle axis is within a plane that is perpendicular to the longitudinal axis of the beam of the wafer comb. The orientation of the nozzles within this plane is indicated by an angle 286 that the nozzle axis 288 makes with a horizontal reference line 287, as shown in FIG. 4. In some examples, the nozzles are orientated toward the mounted edges of the wafers at a nonzero angle 286. Orienting the nozzles in this manner can be advantageous for dislodging slurry and silicon dust that is stuck between adhesive portions, beam tabs or upper portions of the solar wafers in the wafer comb. The angle 286 is less than 80 degrees, such as from 0 degrees to 45 degrees or between 45 degrees and 70 degrees. Typically, the angle is from 0 degrees to 50 degrees, such as from 0 to 10 degrees, between 10 and 20 degrees, between 20 and 30 degrees, between 30 and 40 degrees, or between 40 and 50 degrees. Desirably, the angle 286 is 15 degrees, 20 degrees, or 25 degrees.

Although it is possible to use just one nozzle to clean a wafer comb, it is generally advantageous to use several nozzles spaced out along one or more sides of a wafer comb. Desirably, the center to center separation between all nozzles is the same; however, nozzles may be separated by varying distances along the side of the wafer comb. The nozzle separation should be such that regions of streamlined flow produced by the nozzles are adjacent to regions of stagnant or eddying flow between the nozzles. Desirably, the nozzles are sufficiently separated such that minimum-sized regions of undisturbed wafers exist between adjacent regions of compressed wafers.

In general, the nozzles are separated by center to center distances that are between 1 and 30 times as large as the diameters of the nozzles. Typically the nozzles are separated by center to center distances of between 2 and 15 times as large as the diameters of the nozzles. For example, the nozzles can be separated by center to center distances that are between 2 to 4, 4 to 6, 6 to 8, or 8 to 10 times as large as the diameters of the nozzles. Desirably, the nozzles are separated by center to center distances that are between 4.5 and 6.5 times as large as the nozzle diameter. The nozzles can be separated by distances that are larger than 30 times their diameters (e.g., a single nozzle can be used); however, larger nozzle separations will generally increase the duration of the cleaning process, which may be undesirable. In one example, several nozzles having diameters of 3/8 inches are separated by center to center distances of 2 inches along the side of the wafer comb.

Embodiments described herein can include a nozzle driving mechanism configured to move one or more nozzles horizontally, vertically, or both. Alternatively, in certain embodiments the nozzles are stationary and the wafers movable. As to relative motion between the wafers and nozzles, for mechanical and operational convenience, certain embodiments disclosed herein include both nozzles and wafers to possess motion axes, the nozzles possessing horizontal motion control and the wafers possessing vertical (or vice versa); however, any combination is suitable. The nozzle driving mechanism is connected to the one or more nozzles. The nozzle driving mechanism can be a constant rate mechanism, thereby configured to move the nozzles at a constant speed. The nozzle driving mechanism can be configured to provide linear motion, lateral motion, purely horizontal motion, purely vertical motion, sinusoidal motion, or other combinations thereof. Desirably, the nozzle driving mechanism is configured to move the one or more nozzles laterally along a side of the wafer comb so that all wafers of the wafer comb can be cleaned by the nozzles. For example, the driving mechanism can be configured to move the one or more nozzles laterally along the side of the wafer comb a distance that is equal to the separation between the nozzles.

Embodiments described herein can include a fluid source or a fluid input. The fluids described herein can comprise, for example, water (e.g., tap water), deionized water, or a cleaning solution comprising water, deionized water, an alkaline surfactant, a sodium-free alkaline surfactant, a detergent, KOH, polyethylene glycol, or mixtures thereof. Such fluids are sometimes referred to as "cleaning fluids." Any of the fluids described herein may be heated and provided at various temperatures.

Embodiments described herein can include a discharge manifold having several nozzles in fixed positions relative to one another. The first ends of the nozzles of the discharge manifold are typically coupled to a common fluid source such as a chamber or a section of piping configured to be filled with a fluid but the nozzles can be individually connected to one or more fluid sources such as through tubing or piping connected to the individual nozzles. The nozzles of the discharge manifold can have any number of and manner of positions, orientations, and separations as described herein. In one example, a discharge manifold is a chamber with a series of holes or orifices used for discharging the fluid. The discharge manifold can be configured to move horizontally, vertically, or both relative to the wafer comb.

Figure 5:
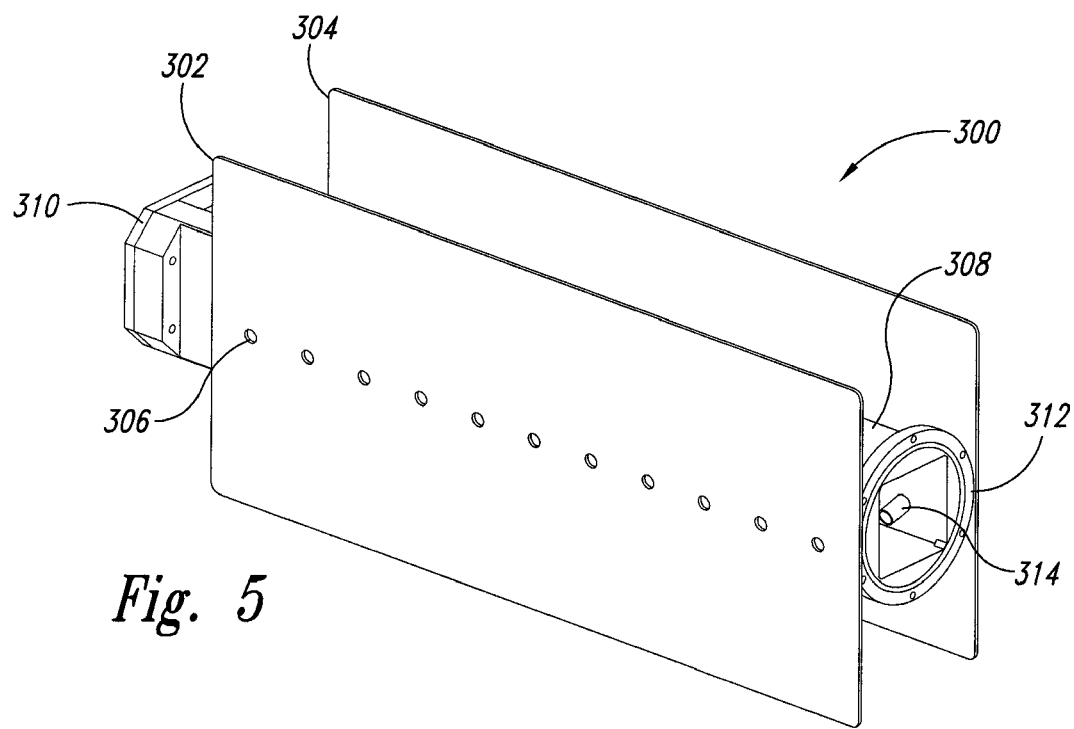
FIG. 5 is a side-view of a representative embodiment of a discharge manifold.
Figure 6:
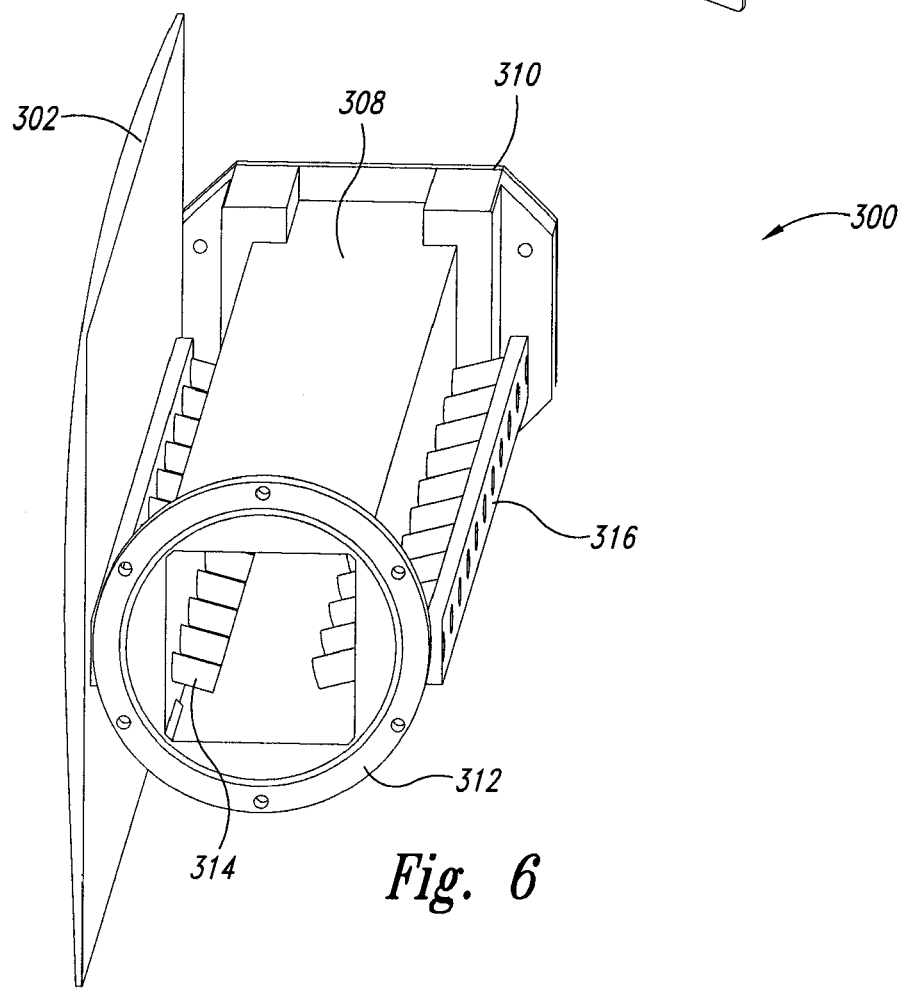
FIG. 6 is an end-view of a representative embodiment of a discharge manifold.

Embodiments of a discharge manifold 300 are shown in FIGS. 5-6. An embodiment of the discharge manifold 300 includes a rectangular chamber 308 having a first end 310 and a second end 312. At least one of the first 310 and the second 312 ends are connected to a source of fluid, and one or both of the first 310 and the second 312 ends can be connected to a tank. Several nozzles 314 are positioned along two opposing sides of the chamber 308 such that fluid contained in the chamber 308 is discharged into a region outside of the chamber through the nozzles 314. Although, the nozzles of the discharge manifold can be of any type and can have any number of sizes, separations, and orientations as described herein, in this embodiment, the nozzles are high aspect ratio flow tubes, all of the same size, and having a uniform separation along the chamber 308. The nozzles 314 are oriented at a nonzero angle relative to the horizontal as shown in FIG. 3.

In this embodiment, the nozzles 314 are connected to a nozzle plate 316 for convenience of mounting the rectangular plates 302, 304 to each side of the chamber 308. The nozzles are coupled to the rectangular plates 302, 304 such that fluid is discharged through orifices 306. The rectangular plates 302, 304 function to protect the wafers prematurely detached during the cleaning process, because eddy or backflow occurs between adjacent nozzles, which tends to pull loose wafers toward the rectangular plate. Without such plates or equivalent structures, loose wafers could be sheared and broken by the moving series of nozzles. Thus the plates prevent detached wafers from entering the region between nozzles. A wafer comb (not shown) can be positioned on either or both sides of the discharge manifold 300, adjacent to the plates 302, 304.

Although this embodiment includes flow tubes 314 positioned along two sides of the chamber 308, nozzles can be positioned along only one side or along more than two sides of the chamber in other embodiments. In this embodiment, the flow tubes 314 extend inward into the manifold chamber 308. However, in other embodiments, the flow tubes can be positioned to be flush with a surface of the chamber 308, or the flow tubes can extend further into the chamber.

Figure 7:
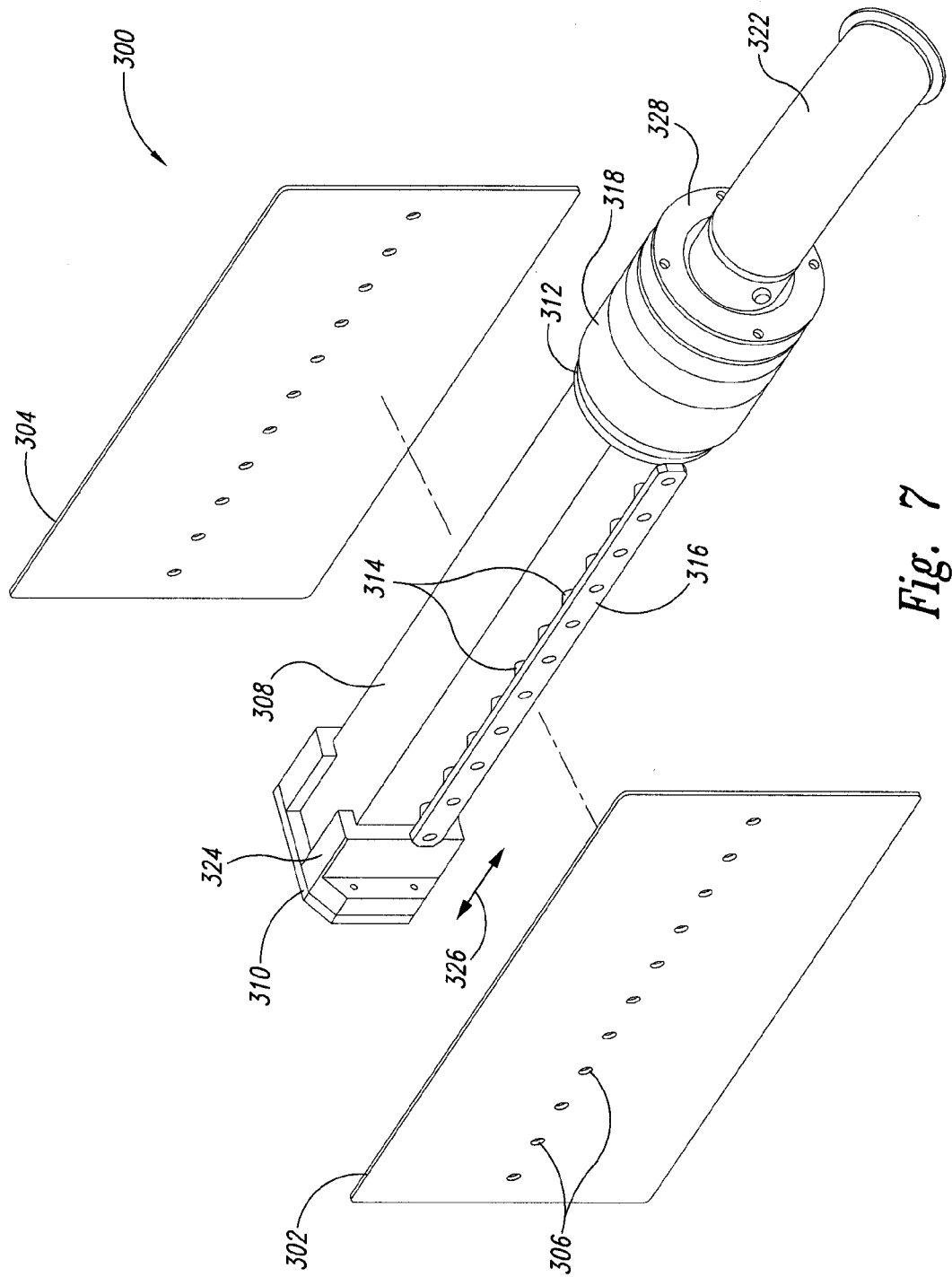
FIG. 7 is a side-view of a discharge manifold configured to have an adjustable lateral position.
Figure 8A:
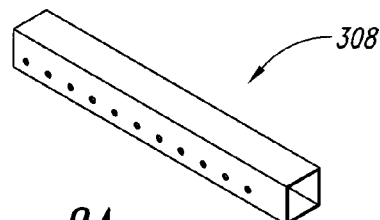
FIGS. 8A-8D illustrate two walls and a cross-section of a chamber of a discharge manifold.
Figure 8B:
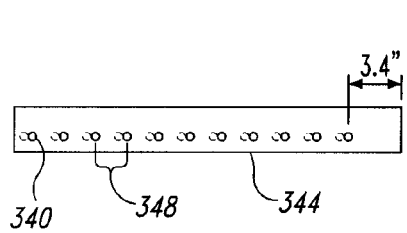
Figure 8C:
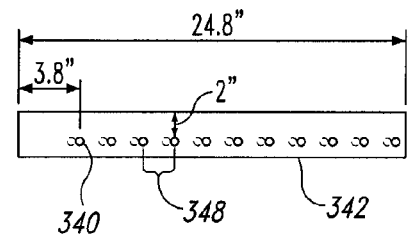
Figure 8D:
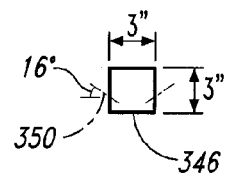

A view of the discharge manifold 300 without plates 302, 304 is shown in FIG. 7. The discharge manifold 300 is configured to allow the chamber 308 and the nozzles 314 to move laterally as indicated by the arrow 326. The first end 310 can be welded shut or otherwise fixed to a support component, typically a bearing block, as shown at 324, and the chamber 308 is movably positioned within the component 324. The bearing block 324 is typically rigidly fastened to a tank (not shown), but may be supported in any suitable manner. That is, the chamber 308 is configured to slide back and forth in the component 324 in the directions indicated by the arrow 326. The second end 312 of the chamber 308 is connected to a bellows 318 to facilitate the lateral motion 326. The bellows 318 is also connected to a plate 328 that can be welded or otherwise fixed to another component such as a tank. Plate 328 contains a support bushing (not shown) in opposition to bearing block 324 such that the entire sub-assembly 300 is slidably mounted within the tank, in such a manner as to permit longitudinal movement while restricting axial rotation. The chamber 308 is connected to a fluid source via piping 322.

Referring to FIGS. 8A-8D, the dimensions of two of the walls 342, 344 and a cross-section 346 of the chamber 308 are illustrated in FIGS. 8A-8D. The dimensions indicated in FIGS. 8A-8D are merely exemplary and chambers described herein need not be limited to these dimensions. A first side 342 and a second side 344 of the chamber 308 are shown having orifices 340 to be connected to a plurality of nozzles. The nozzles are to be connected to the sides of the chamber and to have the angle of orientation shown 350. The separation 348 between the orifices 340 is indicative of the nozzle separation. The orifices of the first side 342 and the second side 344 are shown to be offset from one another so that nozzles connected on each side are not directly across from one another. In other embodiments, the positions of the chamber orifices can have different relative positions than those shown.

Figure 9A:
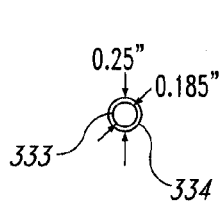
FIGS. 9A-9C provide three views of an exemplary flow tube that may be connected to a discharge manifold.
Figure 9B:
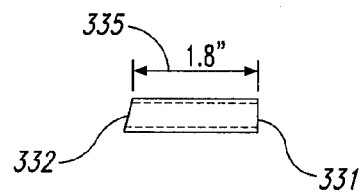
Figure 9C:
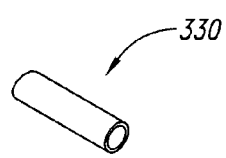

An exemplary flow tube 330 is illustrated in FIGS. 9A-9C. Although dimensions are indicated in FIGS. 9A-9C, the dimensions are merely exemplary and nozzles described herein need not be limited to the dimensions shown. In FIGS. 9A-9C, an inner radius 333, an outer radius 334, and a length 335 of the flow tube 330 are indicated. The flow tube 330 is shown to have a second end 332 that is cut at an angle relative to a first end 331. The second end 332 is cut at an angle such that the second end 332 will be flush with a plate such as rectangular plate 302. For example, the rectangular plate 302 can be mounted parallel to the side of the chamber 308 so that the angle of the cut at the second end 332 of the flow tube 330 corresponds to the angle of orientation of the flow tube 314 along the chamber 308. In other embodiments, the flow tube first ends and second ends can be cut at the same angle, even if they are mounted at a nonzero angle of orientation along the chamber.

Figure 10:
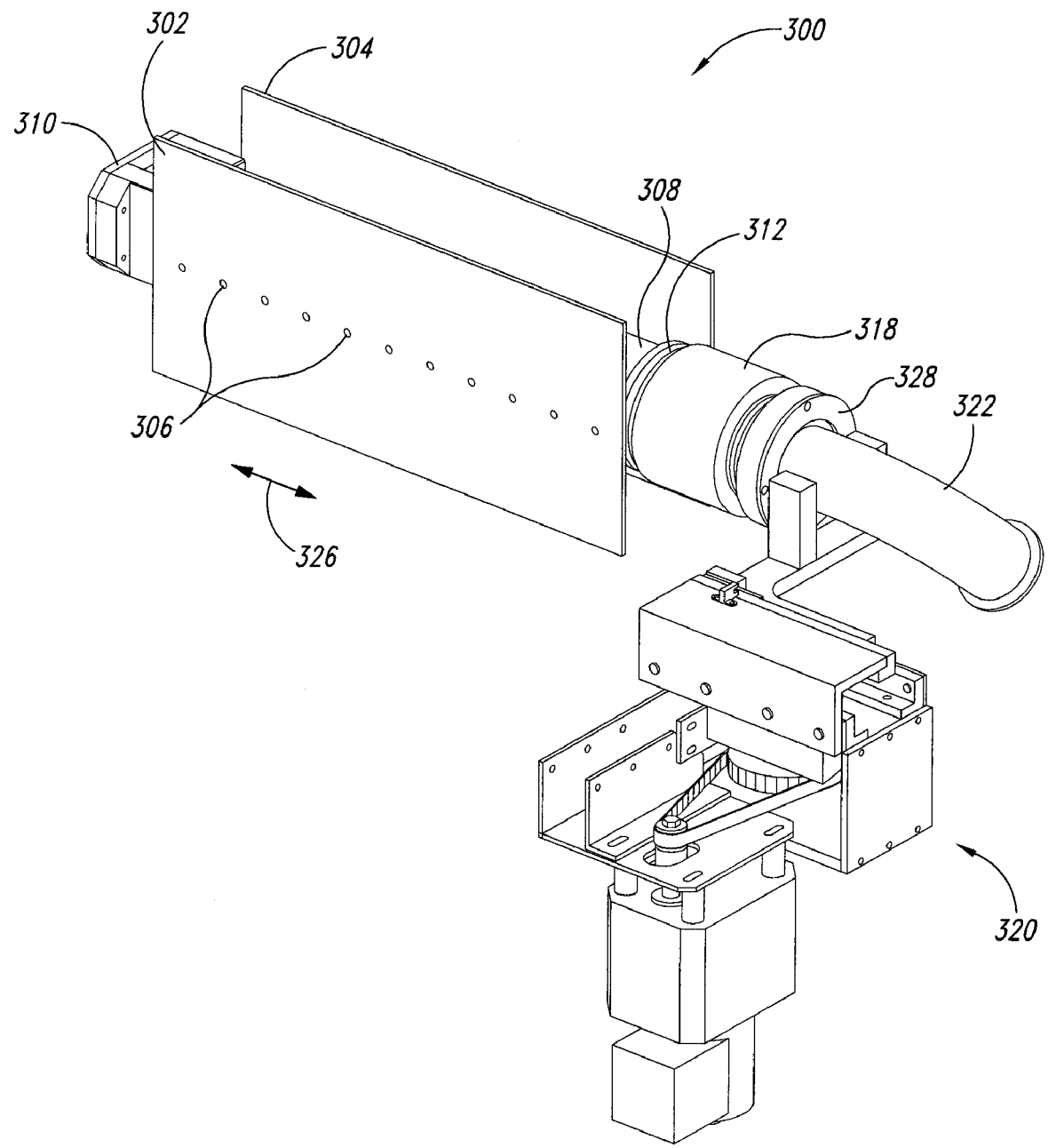
FIG. 10 illustrates an exemplary discharge manifold connected to a reciprocating mechanism for inducing and controlling lateral movement of the discharge manifold.
Figure 11:
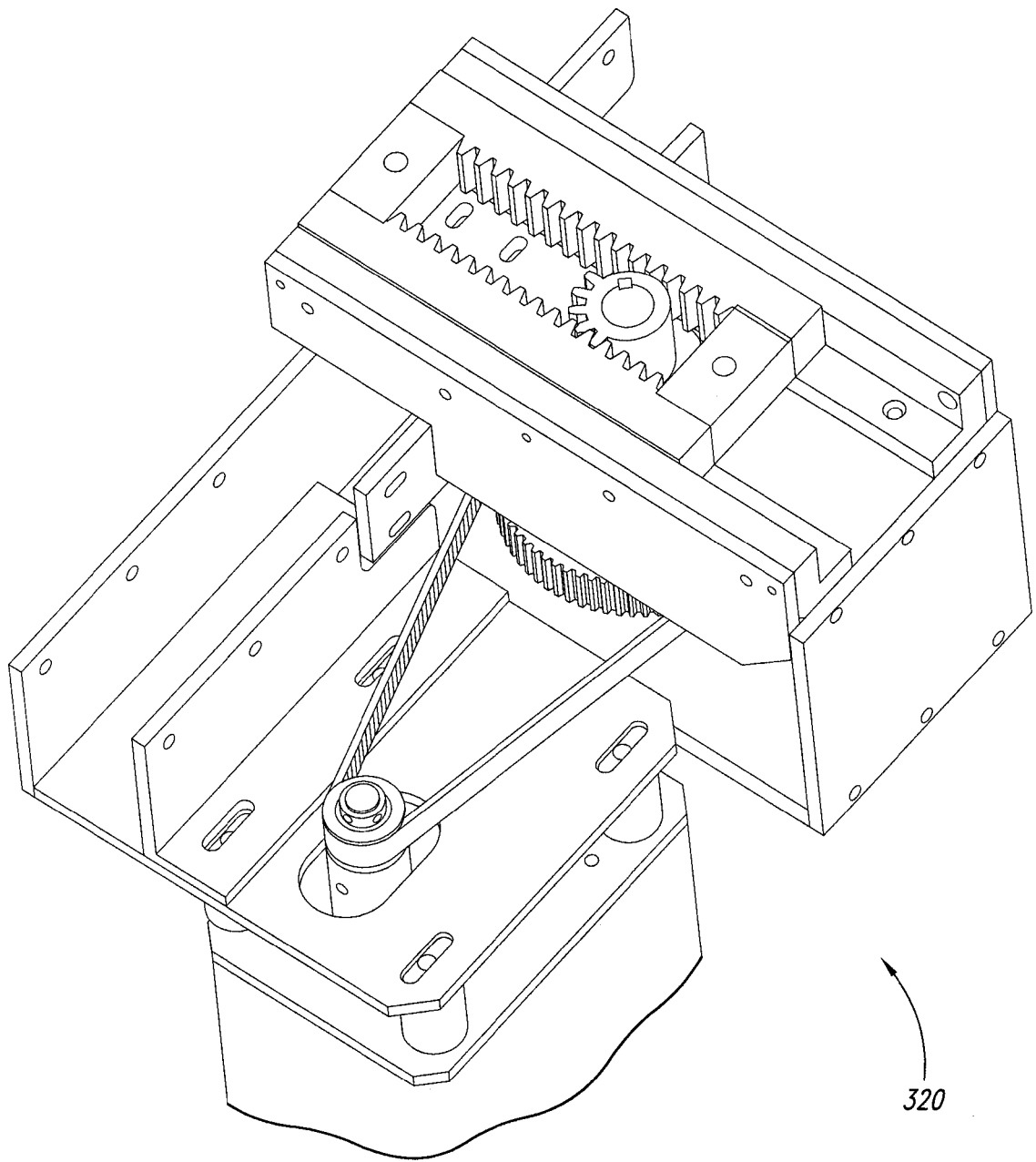
FIG. 11 is an illustration of an exemplary reciprocating mechanism that can be connected to a discharge manifold and used for inducing and controlling lateral movement of the discharge manifold.

A representative embodiment of a discharge manifold 300 connected to a reciprocating mechanism 320 is shown in FIG. 10. The reciprocating mechanism 320 is capable of moving the discharge manifold 300 in the directions indicated at 326. A detailed view of the reciprocating mechanism 320 is shown in FIG. 11. In this embodiment, the reciprocating mechanism 320 is a constant rate oscillation mechanism and therefore provides a constant rate driving mechanism for the lateral motion 326 of the discharge manifold 300. In certain embodiments a linear servo motor or a normal servomotor are used to drive the gears and belt shown, wherein the constant velocity motion profile is created electronically in the servo drive. In yet other embodiments a myriad of constant speed reversing mechanisms are utilized providing a simple, reliable and low-cost option. Importantly, the relative motion between flow jets and wafers is preferably kept constant, irrespective of how the constant relative motion is achieved.

Representative embodiments described herein can include a processing container or tank. The processing tank is configured to receive one or more solar wafer comb(s) and is sufficiently large so that the solar wafer comb can be situated within the tank. The processing tank is also configured to have one or more nozzles situated within the tank relative to the solar wafer comb. The processing tank can be configured to contain the solar wafer comb while the wafers and the one or more nozzles are submerged in a cleaning fluid. A holding tool as described herein can be connected or situated relative to the processing tank such that the holding tool can be used to lower the solar wafer comb into the processing tank and to maintain and/or adjust a position of the solar wafer comb relative to the one or more nozzles within the processing tank.

Desirably, the processing tank is connected to one or more drain outputs, which can include one or more drain valves. The drain output is connected to plumbing for directing fluid from the processing tank to other tanks and/or to a waste drain, such as a sewer input. For example, the processing tank can be connected to a holding tank as described herein. The processing tank can include one or more fluid inputs and can be connected to an overflow tank. The processing tank can include a heater for heating fluid contents of the tank.

Additionally, the processing tank can include a level sensor. An exemplary level sensor, such as a float, capacitive, ultra-sonic, pressure-sensing or other type of sensor is configured to detect the fluid level in the processing tank. The level sensor can be configured to transmit a signal indicative of the fluid level in the tank to a computer or to a controller.

Figure 12:
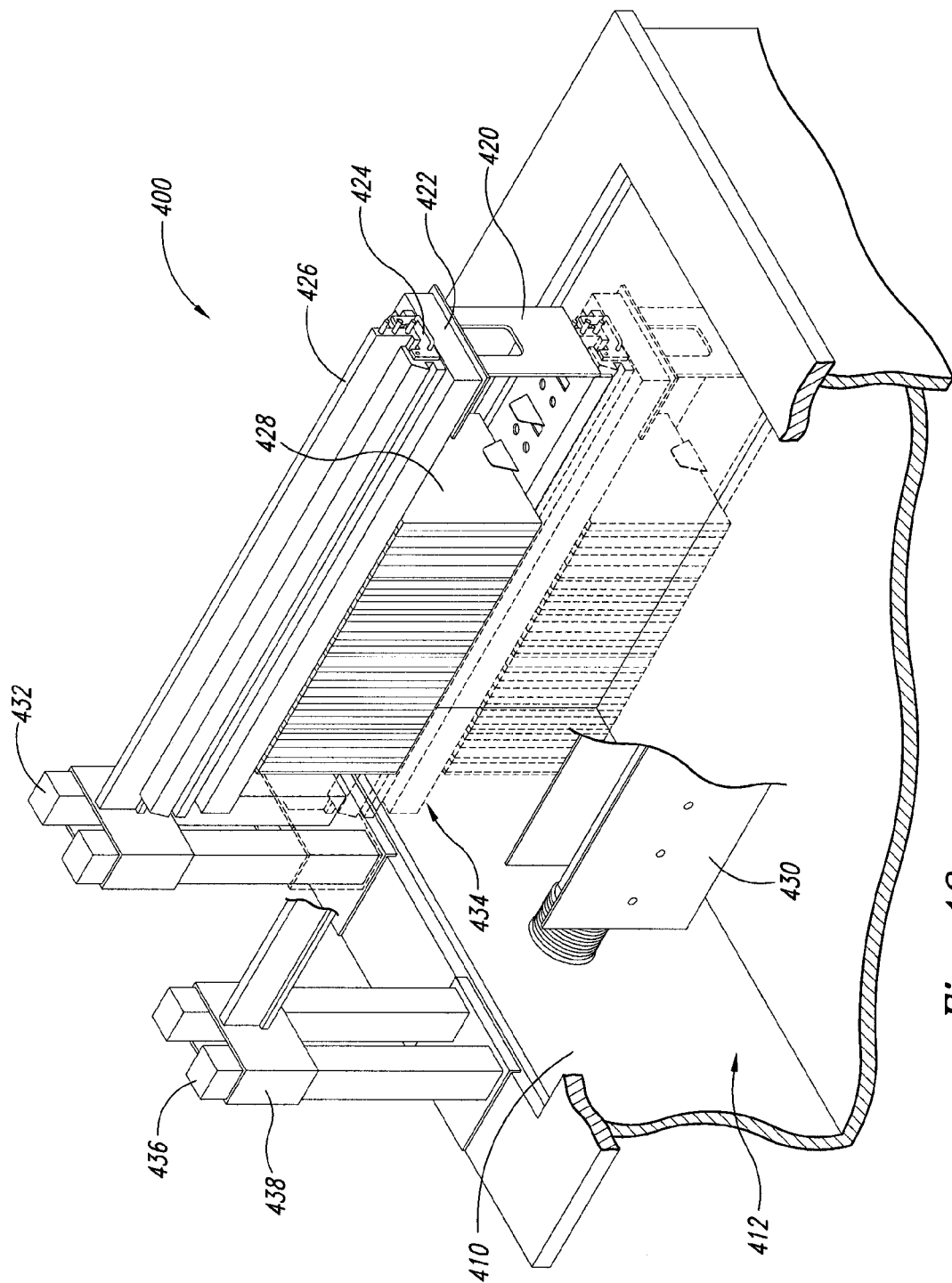
FIG. 12 is an illustration of a wafer comb attached to a holding tool and a positioning of the wafer comb within a tank relative to a discharge manifold.

FIG. 12 is an illustration of an exemplary cleaning apparatus 400 comprising a discharge manifold 430 situated within a processing tank 410. The apparatus 400 also includes a lifting mechanism 432 connected to a holding tool 426 configured to hold a wafer comb 428 in a wafers down orientation, as shown. In the illustration, the beam 422 of the wafer comb 428 is attached to the holding tool 426 by an intermediate tooling component 424. In this embodiment, the beam 422 of the wafer comb 428 is also shown attached to a wafer cage 420. The wafer cage 420 is attached to the beam 422 such that the bottom free edges of the wafer comb 428 are not in contact with the wafer cage 420. For example, a wafer cage is typically mounted to the beam such that the bottom edges of the wafers are a least 1/16 of an inch, but less than 1/4 of an inch (and desirably 1/8 of an inch) from the wafer cage. Although the wafer cage 420 is not necessary, it is particularly advantageous to have the beam connected to a wafer cage when the wafers of the wafer comb are detached from the beam.

The lifting mechanism 432 is also configured to lower the wafer comb 428 into the interior of the processing tank 412 to a second position 434 within the tank and along a side of the discharge manifold 430. In this embodiment, the cleaning apparatus 400 comprises a second holding tool 438 connected to a second lifting mechanism 436. The second holding tool 438 and lifting mechanism 436 can be used to position a second wafer comb (not shown) in the tank along the other side of the discharge manifold 430.

Figure 13:
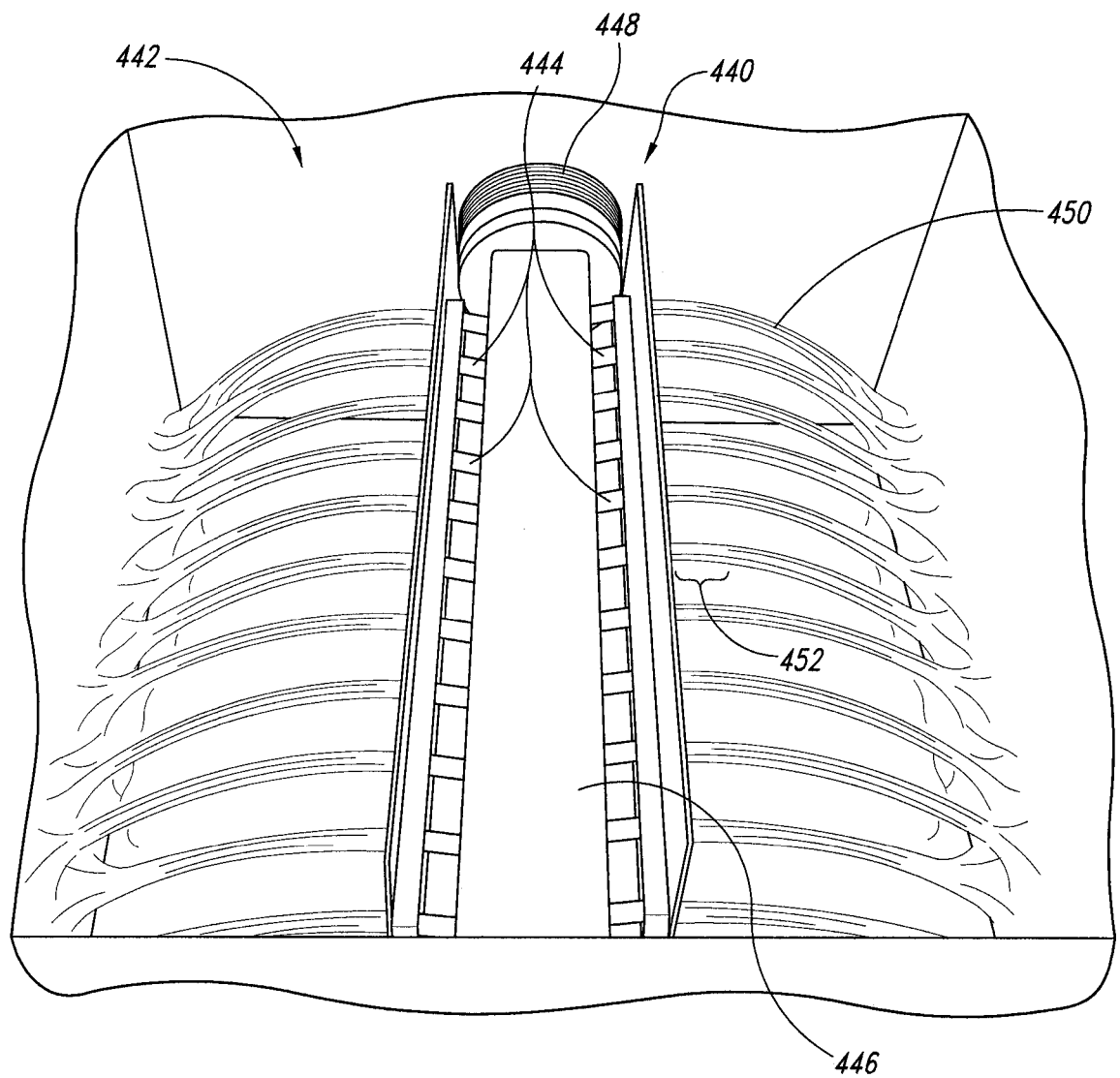
FIG. 13 illustrates a discharge manifold situated within a tank and generating fluid streams.

In FIG. 13, a discharge manifold 440 is shown positioned within a tank 442 while generating several streams of fluid 450. The streams of fluid 450 are discharged by the nozzles 444 connected to the chamber 446 of the discharge manifold 440. The chamber 446 of the discharge manifold 440 is connected to the tank 442 by a movable bellows 448.

Representative embodiments described herein can include a holding tank configured to hold a fluid and connected to the processing tank and/or to the discharge manifold by various plumbing. For example, the holding tank can be connected by various plumbing to the processing tank so that fluid drained from the processing tank can be circulated into the holding tank and reused. A holding tank may be particularly advantageous when hot fluids are used during the cleaning process because recycling these hot fluids conserves energy that would be used for heating new fluid. The holding tank can include a heater for heating the fluid contents of the holding tank. The holding tank can include one or more fluid inputs connected to one or more fluid sources. For example, the holding tank can be connected to a municipal water supply and/or to a deionized water supply. Typically, the holding tank is connected to one or more drains.

Representative embodiments described herein include various plumbing for transporting fluid from one component of the apparatus to another. Exemplary plumbing includes pipes, tubes, feed lines, fittings, and valves. Plumbing can be connected to drain outputs such as a sewer drain and to fluid inputs configured to receive a fluid from a fluid source. Plumbing can be connected to any of the tanks, discharge manifolds, and nozzles described herein. Plumbing can include one or more filters for at least partially removing silicon fines and slurry dust from circulating fluid. For example, a 0.1 micron filter or other mesh filter can be connected to a drain of the processing tank to filter fluid from the processing tank before it is circulated to the holding tank for reuse. Plumbing can be connected to one or more pumps which facilitate fluid circulation between components described herein. Plumbing is desirably configured and designed such that lines and valves drain completely, or nearly completely. In this manner, the "hold-up" or containment of residual dirty fluid in the plumbing lines is minimized or greatly reduced.

Figure 20:
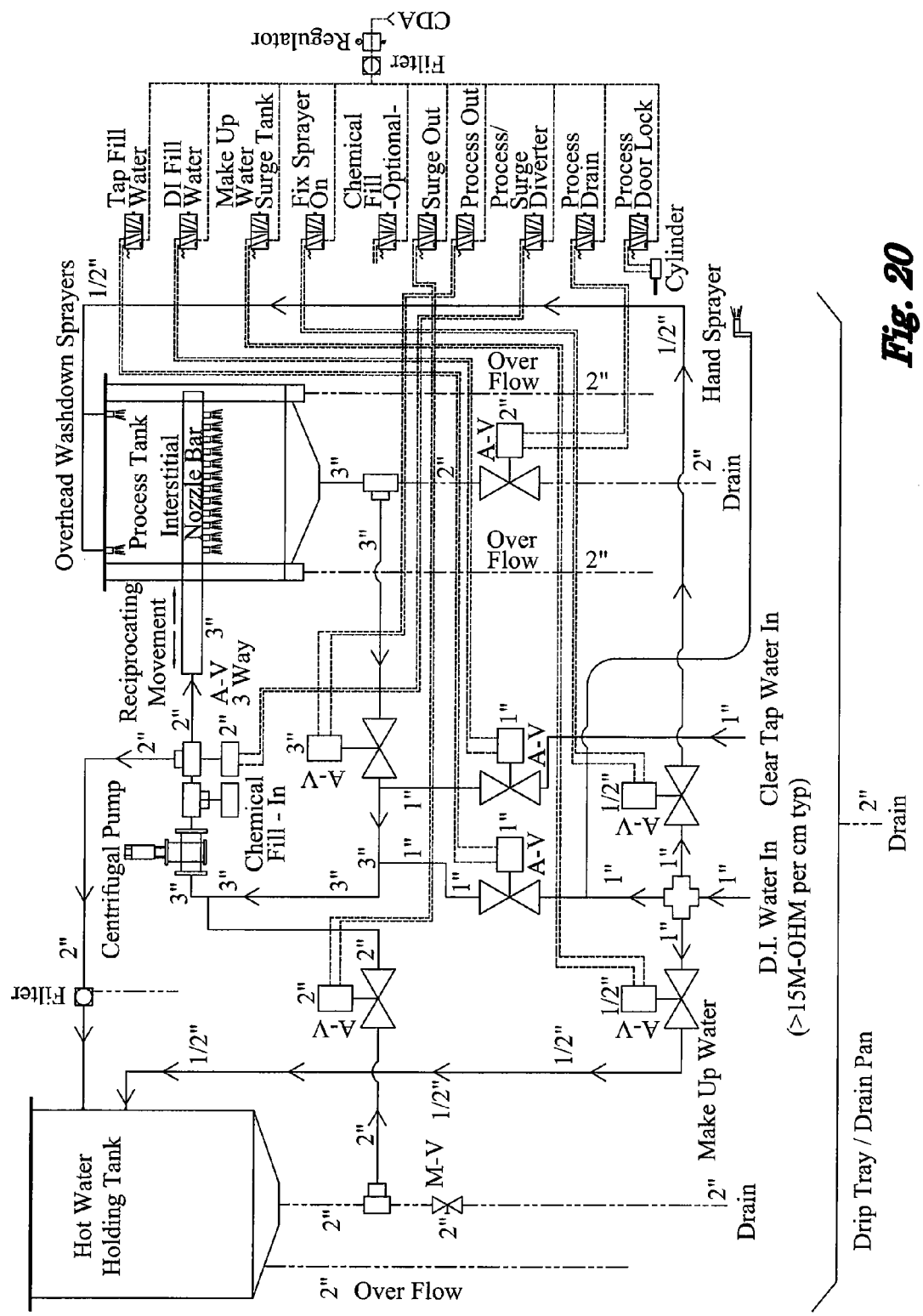
FIG. 20 illustrates an embodiment of the plumbing of an embodiment of the cleaning apparatus.

Exemplary plumbing of a representative embodiment of a cleaning apparatus is illustrated by the plumbing schematic of FIG. 20. An embodiment of fluid flow through the pumping during various cleaning cycles may comprise the following:

1. The operator loads the ingots, closes the doors and presses 'START.' 2. A cleaning step may comprise many steps that constitute one cleaning cycle. The first step may be a wash down of the ingot exterior with overhead sprayers while the drain is open. Referring to FIG. 20, water comes in from the DI source, through the valving and exits through the overhead wash down sprayers. The purpose is to rinse off the exterior of the ingots, since a considerable amount of highly viscous slurry is adhered thereto. To conserve water and make the process as efficient as possible, certain embodiments re-circulate water through the apparatus before discharging it to waste drain. Preferably as much exterior dirt is removed as possible prior to interstitial cleaning. 3. The process tank is filled with clean tap water while the drain valve is closed. The tank is filled to a process level wherein the ingots are submerged below the waterline. This water is then recirculated by the pump, through the interstitial nozzle bar (see FIG. 7). 4. After recirculation, the drain valve opens and the dirty water is drained out. 5. After a low level sensor is met that indicates that the process tank has drained, a drain delay timer runs for e.g., 15 seconds. This is done to allow the plumbing pipes below the tank to empty of residual dirty water, and during the later portion of this time the overhead sprayers are turned on to rinse off any dirt that may adhere to the outer surfaces of the ingots, tank, or tooling. 6. While holding the drain valve open, DI water is flushed through the pump, interstitial nozzle bar. This step is labeled 'pump flush' and is done to thoroughly rinse any remaining dirty water from the pump and associated plumbing before re-filling the system with the next batch of clean water. 7. The tap water recirculate step is then repeated. 8. The water recirculate is then repeated with DI water. Since all of the water in these recirculate steps is flowing through the interstitial nozzle bar, interstitial cleaning is occurring during these steps. 9. A chemical clean using a combination of detergent and an alkali, typically KOH is performed. This is pumped in to the apparatus via a separate system. 10. The chemical clean step may or may not be heated. The process tank contains heaters that can maintain the temperature of the chemical agent during recirculation, if heating is required. After completion of the chemical clean recirculation, the contents of the tank are dumped to drain. 11. Three DI water recirculation steps then occur in sequence to remove all traces of the chemical cleaning agent. Of course, this number, the duration, and temperature are all adjustable. 12. Next, hot water at approximately 94 degrees centigrade is pumped from the hot water holding tank into the process tank; the hot water is recirculated. The hot water debonds or detaches the wafers from the adhesive. After detachment to conserve thermal energy the hot water is pumped back to the holding tank to be reused in the next machine cycle (next batch of ingots). The water is filtered through a set of 0.1 micron filters during return to the holding tank to maintain cleanliness. 13. The wafers are given a final interstitial rinse via recirculated DI water so that the solar wafers dry spot-free and to cool the solar wafers down for safe handling by an operator. There may then be a final DI water top spray with the drain open before the cycle is complete.

Representative embodiments described herein can include one or more pumps. The pumps can be connected via plumbing to components described herein. Exemplary pumps include circulation pumps and other pumps capable of pumping fluid that comprises slurry and particulates and of creating a smooth, non-pulsating flow. A centrifugal pump is generally preferred, although a positive displacement pump coupled with a mechanism for dampening the pulsating flow may be used.

It is generally desirable that the pump be connected to a variable frequency drive so that the frequency of the pump motor is adjustable. For example, when a variable frequency pump is connected through various plumbing to one or more nozzles or to a discharge manifold, the pump can be used to supply fluid to the one or more interstitial cleaning nozzles or to the discharge manifold, and the variable frequency of the motor can be used to regulate a flow rate of the fluid discharge out of interstitial cleaning nozzles.

Representative embodiments described herein can include a flow rate sensor. In general, a flow rate sensor measures a flow rate of a stream of fluid or measures other parameters related to the flow rate which can be used to determine the flow rate. The flow rate sensor can include one or more sensors and transducers. For example, a flow rate sensor can be or can include a flowmeter such as a turbine-type flowmeter or a calibrated pitot tube. The flowmeter measures fluid velocity, which can be used along with a cross-sectional area of the fluid flow to determine a flow rate. In other examples, the flow rate sensor includes a pressure transducer that measures nozzle pressure, the fluid pressure in the chamber of a discharge manifold, or both. Such pressure measurements can be used to determine a fluid velocity and/or a flow rate. The flow rate sensor can be configured to transmit signals representative of a flow rate to a controller or a computer, which in certain embodiments operates a variable frequency drive (VFD) to control the pump motor speed through a closed-loop feedback circuit.

Representative embodiments described herein can include a controller such as a programmable logic controller, such as Allen Bradley Control Logix PLC—available from Rockwell Automation. In general, the controller is a computing device that can include or be connected to one or more processors, one or more input devices, one or more output devices, one or more communication connections, and one or more types of storage. For example, the controller can be connected to a processor which is configured to execute computer-executable instructions stored in the storage. Exemplary storage includes memory and other computer-readable media. For example, memory can be volatile memory (e.g., registers, cache, RAM), non-volatile memory (e.g., ROM, EEPROM, flash memory, etc.), or some combination of the two. Storage can be removable or non-removable, and includes magnetic disks, magnetic tapes or cassettes, CD-ROMs, DVDs, or any other computer-readable media which can be used to store information and which can be accessed by the controller. The storage can store software containing computer-executable instructions.

Exemplary output devices include a display, printer, speaker, CD-writer, or other device that provides output from the controller. Exemplary input devices include touch input devices such as a keyboard, keypad, touch screen, mouse, pen, or trackball, a voice input device, a scanning device, or other device that provides input to the controller.

Additionally, the controller is coupled to various system components described herein and is used to regulate, monitor, and control such components. Typically, the controller is configured to transmit to and/or to receive signals from the various components. For example, the controller can be connected to one or more of the sensors described herein and configured to receive signals from the sensors. The controller can be further configured to transmit signals to other components based on the received signals. For example, the controller can be coupled to one or more plumbing valves and configured to transmit signals to open or close the valves, thereby controlling fluid flow. The controller can be coupled to a flow rate sensor and configured to receive signals from the flow rate sensor. The controller can be coupled to one or more pumps to control pump operation. The controller can be coupled to one or more heaters and/or temperature sensors to regulate fluid temperature. The controller can be coupled to one or more mechanisms configured to adjust the relative position of the wafer comb and the nozzles or discharge manifold. For example, the controller can be coupled to one or more encoders and configured to receive signals representative of the position of the wafer comb from the encoders. The controller can be coupled to a nozzle or discharge manifold driving mechanism and used regulate the position of the nozzles or of the discharge manifold.

The controller can be programmed or include software containing computer-executable instructions for controlling the various system components described herein. For example, the controller can be used to execute a predetermined cycle of cleaning or to run a series of process steps automatically. The controller can also be used by an operator to manually adjust system components through input devices described herein.

Representative embodiments described herein can include (but in no manner must include) pre-wash sprayers to perform an optional preliminary clean of the wafer comb The sprayers can be any type of hollow, solid cone, or flat fan sprayers and the nozzles can be conventional high-pressure spray nozzles. The pre-wash sprayers are typically situated such that the wafer comb in a wafers down orientation is sprayed by the sprayers from above the beam. For example, the sprayers can be directed at the holding tool or at the beam of the wafer comb. In this manner, the high pressure spray does not damage the fragile wafer comb. The sprayers used for pre-wash provide an exterior wash or quick "hose off" of the holding tool and the wafer comb prior to cleaning and are not meant to provide any interstitial cleaning or a final clean to the wafers of the wafer comb. The pre-wash sprayers can be mounted in the processing tank. For example, the pre-wash sprayers can be mounted to a set of doors connected to the tank that close to position the sprayers above the wafer comb. The pre-wash sprayers are connected via feedlines to a fluid source. The pre-wash sprayers can be operated at a pressure of between 40 and 100 psi, such as between 50 and 80 psi, or between 60 and 70 psi. Desirably, the pre-wash sprayers are operated at 65 psi.

Figure 14:
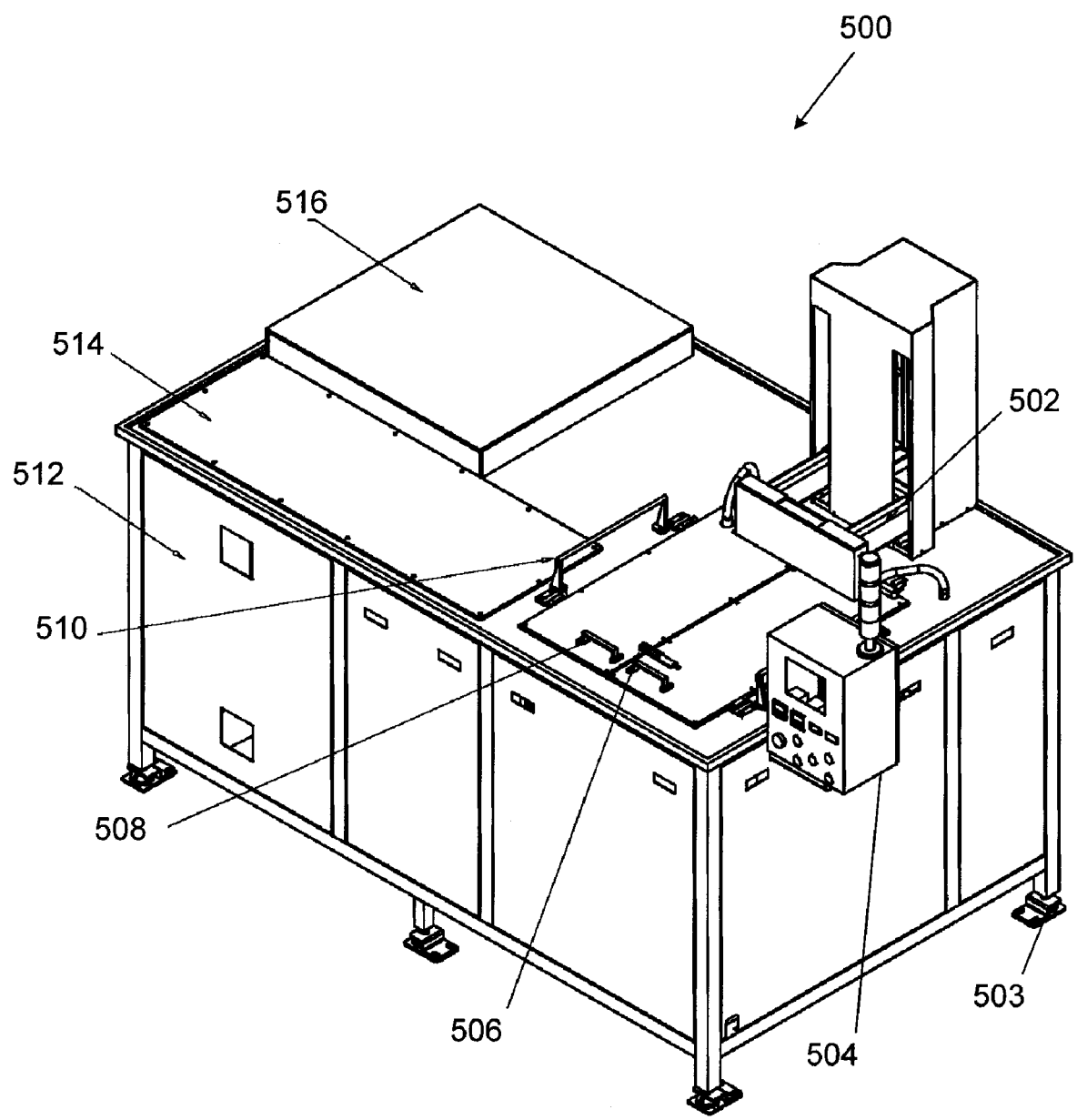
FIG. 14 illustrates an embodiment of a solar wafer cleaning apparatus.

FIG. 14 is a representative embodiment of a solar wafer cleaning apparatus 500. The apparatus 500 includes a wafer comb lifting mechanism 502 that can be configured to lower one or more wafer comb(s) into the processing tank below the tank doors 508. In this embodiment, the tank doors 508 are configured with a tank door lock 506 for safety and with door stops 510 for convenience. The solar wafer cleaning apparatus 500 further includes a controller 504, electrical components housed in the electrical enclosure 512, and a storage tank situated below the storage tank cover 516. The solar wafer cleaning apparatus 500 further includes a work surface 514. Leveling feet 503 can be used to level the cleaning apparatus such that fluid drains and flows appropriately.

Figure 15:
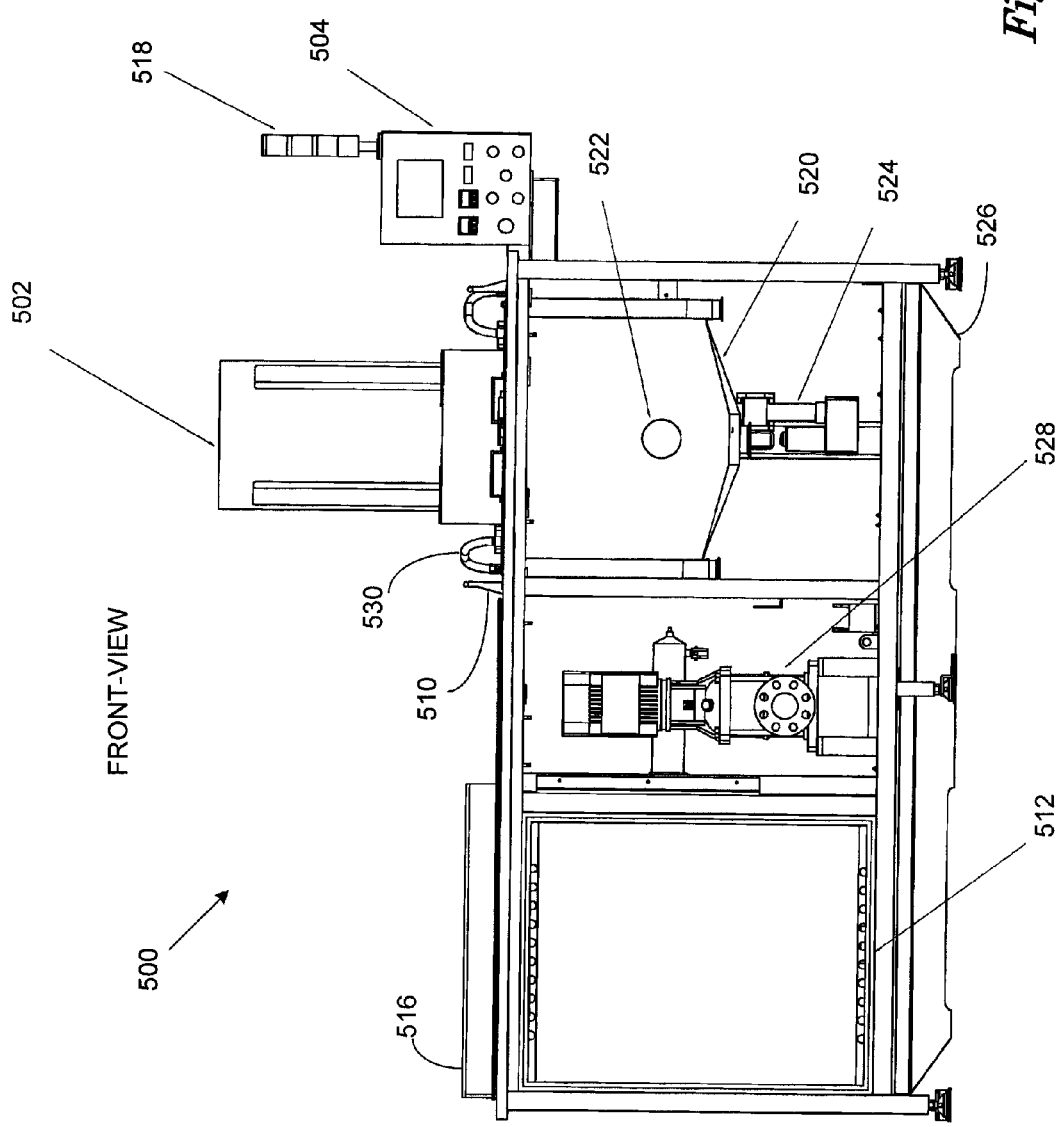
FIG. 15 is a front-view of the solar wafer cleaning apparatus of FIG. 14.

FIG. 15 is a front-view of the solar wafer cleaning apparatus 500. The controller 504 is shown to be connected to a process status light 518. The process status light 518 is a convenient way to indicate a status of operation of the apparatus 500. For example, the process status light 518 can change colors to indicate a length of time remaining in a cycle or to indicate which process cycle is currently being executed.

A processing tank 520 is shown to include a tank heater 522. Fluid present in the processing tank 520 can be drained and recirculated through drain valve plumbing 524. Feedlines 530 supply pre-wash sprayers mounted to the inside of the process tank doors 508 with fluid for performing a wafer comb pre-wash. In this embodiment, the apparatus 500 includes a drain pan 526 for convenience. For example, the drain pan 526 can facilitate cleanup of spilled fluids. The apparatus 500 also includes a circulation pump 528.

Figure 16:
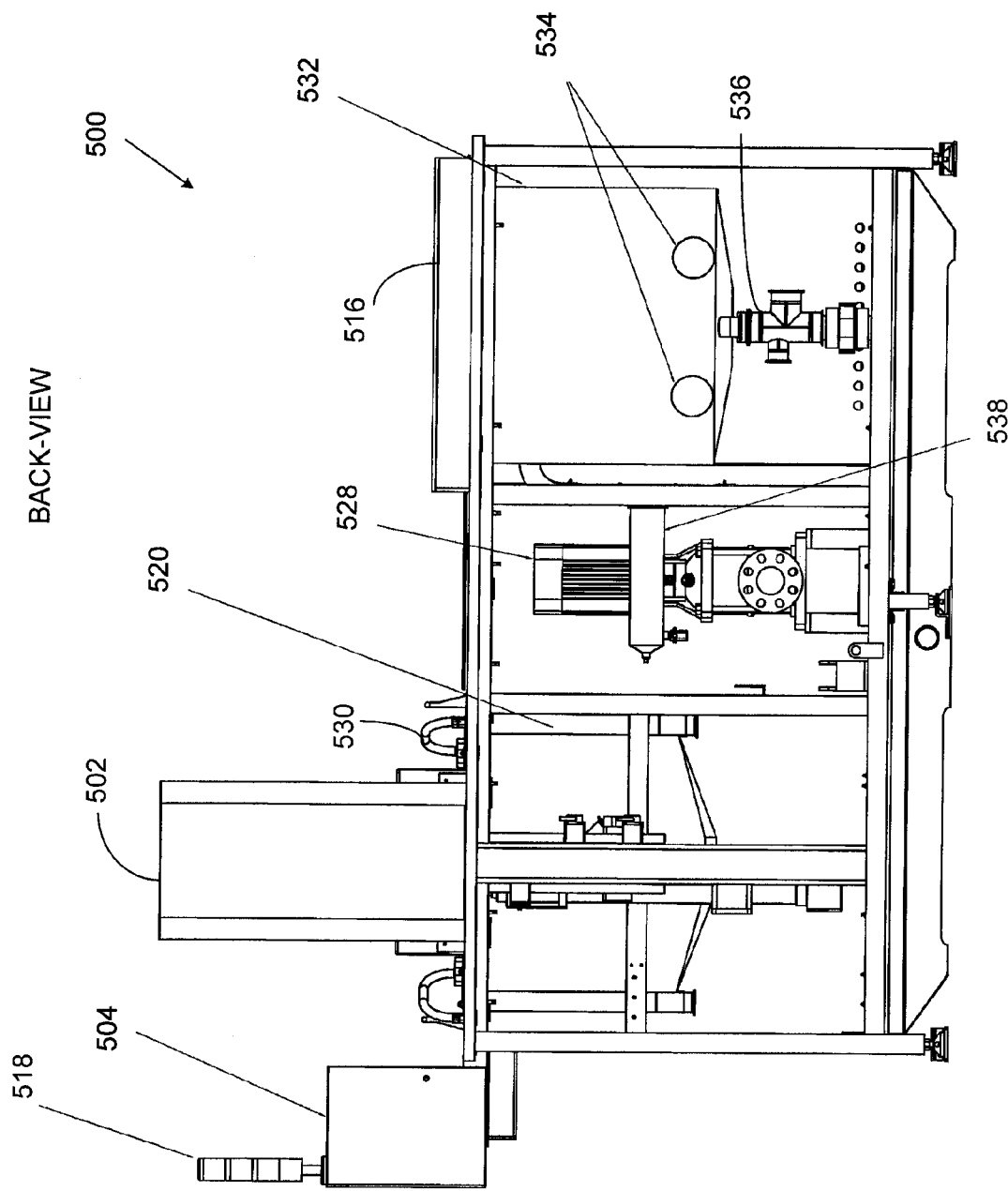
FIG. 16 is a back-view of the solar wafer cleaning apparatus of FIG. 14.
Figure 17:
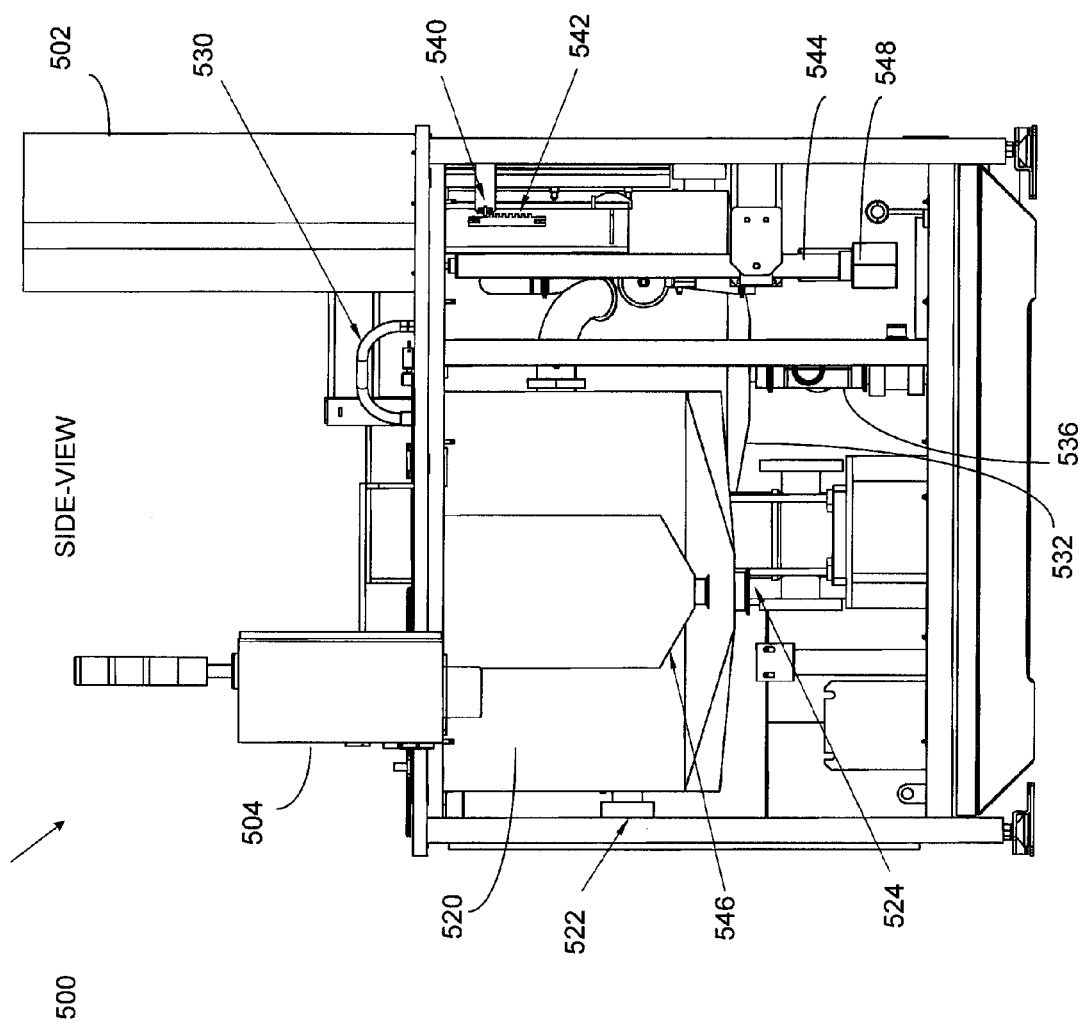
FIG. 17 is a side-view of the solar wafer cleaning apparatus of FIG. 14.
Figure 18:
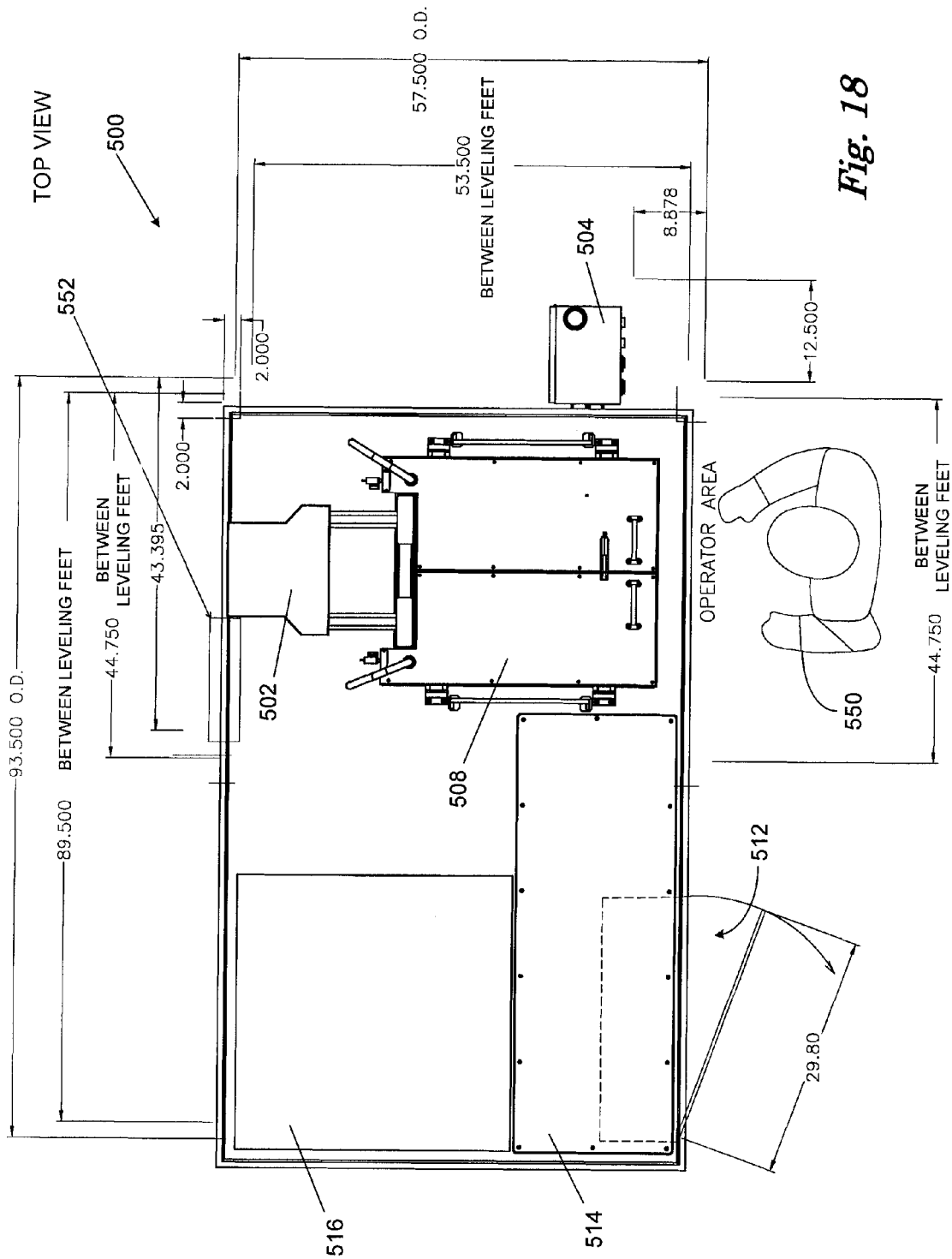
FIG. 18 is a top-view of the solar wafer cleaning apparatus of FIG. 14.

FIG. 16 is a back-view of the solar wafer cleaning apparatus 500. Apparatus 500 is shown to include a storage tank 532 connected to heaters 534. The storage tank 532 is also connected to drain plumbing 536 and to a filter 538. FIG. 17 is a side-view of the solar wafer cleaning apparatus 500. In this embodiment, the processing tank 520 is connected to an overflow tank 546. The wafer comb lifting mechanism 502 of the apparatus 500 includes a mast 544 that is connected to a linear actuator 548. The lifting mechanism 502 is also connected to the encoder 542 and encoder sensor 540, which detect the position of the lifting mechanism 502. FIG. 18 is a top-view of the solar wafer cleaning apparatus 500 with exemplary dimensions indicated. The dimensions provided in FIG. 18 are merely exemplary and all solar wafer cleaning embodiments described herein are not bound by or limited to the dimensions shown. FIG. 18 illustrates an operator 550 positioned relative to the apparatus 500. The apparatus 500 also includes a service utilities connection area 552. In this embodiment, the service utilities connection area 552 is located on the back-side of the solar wafer cleaning apparatus 500. The service utilities connection area 552 includes various inputs for receiving various consumables used by the apparatus. For example, the service utilities connection area 552 can include an electrical input for receiving power from a power supply, a water input (e.g., a connection to city tap water), a deionized water input, a compressed air input, and combinations thereof.

In a first embodiment of a method for cleaning solar wafer combs, a solar wafer comb comprising a plurality of solar wafers attached to a beam is received and submerged in a fluid bath. The method further includes sequentially expanding interstitial regions of one or more groups of solar wafers in the solar wafer comb to clean the solar wafers while on the beam. The methods (and apparatus) for solar wafer cleaning disclosed herein provide clean solar wafers without causing either visible damage and/or damage to greater than 5%, or 10%, or 15%, or 20%, or 25%, or 30%, or 50%, of the solar wafers cleaned using the disclosed embodiments of the solar wafer cleaning methods and apparatus.

In a second embodiment of a method for cleaning solar wafers, a central solar wafer and a first and a second solar wafer both immediately and oppositely adjacent to the central solar wafer are submerged in a fluid bath, each of the wafers being adhered to a beam at respective top edges as part of a wafer comb. The embodiment further comprises flowing fluid between the central wafer and the first wafer to increase a separation between the surfaces of the central and the first wafer, removing slurry from the surfaces of the central and the first wafer using the flowing fluid, and adjusting a position of the flowing fluid to decrease the separation between the surfaces of the central and the first wafer and to increase a separation between the surfaces of the central and the second wafer.

In a third embodiment of a method for cleaning solar wafers, several streams of fluid are generated and directed at a side of a wafer comb. A single cycle of interstitial cleaning is then performed, wherein a cycle of interstitial cleaning comprises moving the streams of fluid along the side of the wafer comb a distance that is at least as large as the distance between the streams of fluid. The method further comprises changing a vertical position of the streams of fluid, such as by raising or lowering the streams of fluid, and then performing another cycle of interstitial cleaning. The method can further comprise steps of changing the vertical position of the streams of fluid and of performing cycles of interstitial cleaning. Although the method describes moving and changing a vertical position of the streams of fluid, the wafer comb can be moved relative to the streams of fluid either additionally or alternatively.

In an embodiment of a method for generating a fluid pattern in a fluid bath to be used for cleaning solar wafers of a wafer comb while the wafers are on the beam, a plurality of parallel, spaced apart jets of fluid are produced in the fluid bath. The method further includes generating alternating regions of streamlined flow and turbulent flow using the jets, and adjusting a fluid velocity of each of the jets such that the fluid velocity is within a suitable range of fluid velocities sufficient for on beam cleaning of a wafer comb without damaging wafers of the wafer comb.

In an embodiment of a method for cleaning and detaching wafers, a wafer comb is situated along a side of a discharge manifold within a processing tank. The processing tank is filled with a fluid until the fluid has submerged the wafer comb and the fluid is discharged at a predetermined fluid velocity using several nozzles positioned along the side of the discharge manifold. The method further includes moving the discharge manifold perpendicular to a direction of fluid discharge from the nozzles, and contacting the wafer comb with a fluid at an elevated temperature until the wafers detach from the wafer comb.

Representative embodiments described herein can include generating or producing one or more streams of fluid. Streams of fluid can be produced by any nozzles described herein or generated using any nozzles and discharge manifolds described herein. Desirably, the generated streams of fluid are streamlined when intersecting the edges of the wafers of the wafer comb. For example, in FIG. 13, a streamlined portion 452 of a stream of fluid 450 is indicated. Streamlined flow is generally defined as non-turbulent fluid flow in which the majority of the molecules are moving in the same direction relative to one another. For example, velocity vectors assigned to the particles in a cross-section of a flow will be parallel in a streamlined flow. Streamlined flow can sometimes be laminar, although it is not necessarily laminar. A streamlined flow can be advantageous because it can reduce and possibly prevent excessive turbulence in the flow which can result in wafer twisting and ultimately in wafer damage. Excessive turbulence can be evidenced as shuttering or vibrating of the wafers in the wafer comb, which may eventually result in the premature release of the wafers from the beam or breakage of or other damage to the solar wafers.

Representative embodiments described herein include using a stream of fluid to separate at least one pair of immediately adjacent solar wafers of a wafer comb and to remove at least a portion of the slurry, silicon dust, or other contaminants present in the interstitial region of a pair of the immediately adjacent solar wafers. The pair of separated wafers can be part of a group of separated wafers, and the pair or group of separated wafers are referred to as "expanded wafers." In separating the pair of wafers, the wafers remain attached to the beam at respective mounted edges, and the distance between the wafers at respective free edges is typically larger than the kerf width. Typically, the distance between adjacent surfaces of expanded wafers is between 0.025 inches (0.6 mm) and 0.030 inches (0.8 mm) or between 2 and 6 times the wafer thickness. At a minimum, expanded wafers should be expanded to a separation of twice the kerf width. Desirably, the surfaces of the expanded wafers are separated by distances that are 3 to 4, 4 to 5, or 5 to 6 times the kerf width. Although separation distances may be larger than 6 times the kerf width, in general, wafer separation at and above 10 times the kerf width is not desirable since premature wafer detachment will likely occur.

In separating at least one pair of immediately adjacent solar wafers, a pair or group of wafers having decreased separation form adjacent to (on either or both sides of) the pair or group of expanded wafers. The pair or group of wafers having decreased separation is referred to as "compressed wafers." The compressed wafers can be separated by distances that are less than the kerf width and may be in contact with one another. Methods of cleaning described herein in which adjacent regions of compressed and expanded wafers are produced are referred to as "interstitial cleaning." By using several streams of fluid, a series of alternating regions of compressed and expanded wafers can be generated.

Without being limited to any particular theory, it is currently believed that the separation between expanded wafers is a result of a dynamic equilibrium between water flow forces on the surfaces of each of the expanded wafers. Therefore, the separation distance between expanded wafers is a function of the size of the fluid flow, the fluid velocity, as well as the wafer surface area and mass.

The wafers of the wafer comb are cleaned by flowing fluid through the expanded interstitial regions of the expanded wafers. However, compressed wafers are not generally being cleaned because fluid flow through the compressed interstitial regions is reduced. Desirably, to clean all interstitial regions of a wafer comb, each pair of wafers of the wafer comb is incrementally or sequentially expanded. That is, desirably, the regions of expanded and compressed wafers are moved along the wafer comb such that all wafers experience interstitial cleaning.

Exemplary expanded and compressed wafers of a wafer comb 200 are shown in FIG. 2. Regions of expanded, compressed, and undisturbed wafers are indicated by regions 260. As shown, the wafers 210 of the wafer comb 200 are compressed, expanded, or undisturbed based on their locations relative to the nozzle flow regions 240, 242. The flow regions 240 represent the general size of a streamlined flow impacting the solar wafer comb 200. The flow of fluid through each of the flow regions 240, 242 is sufficient to spread a group of wafers thereby generating a region of expanded wafers. Adjacent to each region of expanded wafers are two regions of compressed wafers. The illustrated wafer comb also includes groups of undisturbed wafers between regions of compressed wafers. There may or may not be such groups of undisturbed wafers depending upon the number of nozzles producing fluid streams and the relative positions of the fluid streams to one another.

By increasing the separation between wafers in the expanded regions, fluid is able to flow into the interstitial regions 250 and remove residual slurry and silicon dust. The expanded, compressed, and undisturbed regions can be moved along the wafer comb 200 by moving the wafer comb 200 laterally 243, 244 relative to the flow regions 240, 242, moving the flow regions 240, 242 laterally 243, 244 relative to the wafer comb 200 (e.g., by moving nozzles or a discharge manifold producing the flow region 240, 242), or both. The arrows 241, 243 indicate that lateral motion is parallel to the longitudinal axis 243 of the beam 230. A desirable total relative lateral movement 270 is indicated in FIG. 2. The indicated distance 270 is based on the separation between the flow regions 240, 242. A relative lateral movement (i.e., along the side of the wafer comb) of the indicated distance 270 typically allows all wafers on the wafer comb 200 to be expanded and to experience interstitial cleaning. A desirable speed of lateral motion will be discussed in more detail later in the specification.

Although the illustration of FIG. 2 shows a particular number or percentage of wafers of the wafer comb in each of the compressed, expanded, and undisturbed regions, more or fewer wafers than shown can be within each region. For example, for wafers having a thickness of 200 microns or 225 microns and flow regions of ½ inch in diameter, 25 wafers are typically within a region of expanded wafers. In addition, by decreasing the separation between the flow regions 240, 242, regions of undisturbed wafers need not be generated and regions of expanded wafers can be separated by a single, larger region of compressed wafers.

Representative methods of operation described herein can include producing a stream of fluid having a particular flow rate or discharging fluid such that the fluid has a particular velocity. As will be explained in more detail later in the specification, for wafers on a wafer comb having a particular size, thickness, and type (i.e., material composition) that have been cut using a particular slurry, a range of flow rates can be determined that provide suitable interstitial cleaning while the wafers are on the beam. Furthermore, for a particular flow size, a range of fluid velocities can be determined that provide suitable interstitial cleaning while the wafers are on the beam. As used herein, flow rate is the product of the cross-sectional area of the stream of fluid at discharge and the fluid velocity. The cross-sectional area of the stream of fluid depends on the size and type of nozzle used to discharge the fluid. For example, if the nozzle is a flow tube, the cross-sectional area of the stream of fluid is the cross-sectional area of the flow tube.

The fluid velocity can be measured or calculated using methods and means known in the art. For example, fluid velocity can be determined using a flowmeter. Fluid velocity can also be determined by measuring the passage of time to pump a known volume of fluid through a known cross-sectional area. For example, if 1 cubic foot of water is pumped through an orifice having a cross-sectional area of 0.1 square feet every second, the velocity of the water is 10 feet per second, as determined using basic conservation principles. The velocity of fluid discharged from a nozzle can typically be adjusted by increasing or decreasing the supply pressure, such as by increasing or decreasing the angular velocity of a centrifugal pump supplying fluid to the nozzle.

For typical solar wafer combs, a suitable range of fluid velocities is between 0.5 feet per second and 30 feet per second, and desirably at less than 16 feet per second. For example, a suitable range of fluid velocities is desirably between 0.5 and 16 feet per second, such as between 1 and 4 feet per second, between 2 and 6 feet per second, between 4 and 8 feet per second, between 6 and 10 feet per second, between 8 and 12 feet per second, or between 10 and 14 feet per second.

Lower fluid velocities can be used for interstitial cleaning, however, such velocities may increase the duration of the cleaning process unnecessarily. Furthermore, such velocities may result in insufficient cleaning. For example, a portion of the surface of the wafers may remain dirty. Higher fluid velocities can be used provided they do not produce wafer damage. For example, fluid velocities that are too high tend to cause wafers to rip off the beam which results in wafer damage. An exemplary method for determining whether a fluid velocity is too high includes setting the fluid velocity to a particular velocity and cleaning the wafers of the wafer comb for a long period of time compared to the desired duration of the cleaning cycle. For example, for a desired cleaning cycle duration of 1 to 1.5 hours, or less than 1 hour, or less than 1.3 hours, or less than 1.5 hours or less than 2 hours, a desired observation time may be 4 to 8 hours. If, after 4 to 8 hours of being washed by fluid moving at the particular velocity, the wafers are damaged, the particular velocity would be considered to be too high.

In general, it is advantageous to use lower fluid velocities when the wafers are more fragile (e.g., extremely thin) and a higher range of fluid velocities can be used for more robust wafers (e.g., thicker wafers). For example, for a wafer comb comprising wafers having thicknesses of between 200 microns and 225 microns, a suitable range of fluid velocities is typically between 8 and 12 feet per second. For a wafer comb comprising wafers having thicknesses of between 100 microns and 125 microns, a suitable range of fluid velocities is typically between 2 and 6 feet per second.

A suitable range of flow rates is typically between 0.7 cubic inches per second and 160 cubic inches per second, such as between 1 cubic inch per second and 40 cubic inches per second, or between 2 cubic inches per second and 25 cubic inches per second. For example, for nozzles having diameters of between 0.2 inches and 0.3 inches, flow rates are typically between 0.7 cubic inches per second and 15 cubic inches per second, such as between 3 cubic inches per second and 12 cubic inches per second. For nozzles having diameters between 0.3 inches and 0.45 inches, flow rates are typically between 1 cubic inch per second and 35 cubic inches per second, such as between 5 cubic inches per second and 25 cubic inches per second. For nozzle diameters between 0.35 inches and 0.4 inches, it may be desirable to have flow rates between 2 cubic inches per second and 25 cubic inches per second, such as between 5 cubic inches per second and 20 cubic inches per second, or between 10 cubic inches per second and 16 cubic inches per second.

Flow rates can be adjusted by changing the size of a fluid discharge device, the velocity of the discharged fluid, or both. Flow rate can be reduced, for example, by reducing the fluid velocity when the size of the flow remains unchanged. For example, for the same nozzle, flow rate will decrease if the velocity of the discharged fluid is decreased. Alternatively, to reduce flow rate, the nozzle size can be reduced and the fluid can be discharged with the same fluid velocity.

Lower flow rates can be used; however, if a flow rate is too low, slurry and other contaminants in the interstitial regions will not be removed, and the wafer cleaning will be inadequate or very slow. Alternatively, if the flow rate is too high, wafer damage will occur. A range of suitable flow rates therefore exists between these two extremes of wafer damage and insufficient cleaning. Because flow rate depends on both the fluid velocity and the cross-sectional area of the stream of fluid, for a particular nozzle, there exits a range of suitable fluid velocities, and, likewise, for a particular fluid velocity, there exists a suitable range of nozzles sizes.

In general, thinner, more fragile wafers should be cleaned using a lower range of flow rates than thicker, less fragile wafers. In one example, a suitable range of flow rates for a wafer comb comprising wafers having thickness of 225 microns is between 8 and 18 cubic inches per second, and desirably between 10 and 15 cubic inches per second. In another example, a suitable range of flow rates for a wafer comb comprising wafers having thickness of 100 microns is between 1 and 10 cubic inches per second, and desirably between 2 and 8 cubic inches per second.

Without being limited to any particular theory, a range of suitable flow rates appears to be related to the total energy transferred to a wafer through viscous forces. Specifically, the inventor has observed a relationship between the fluid velocity needed to remove particles and films from the wafer surfaces, and the tendency of the moving fluid to transfer energy to the wafers which eventually leads to flutter, twist and breakage of the wafers. Understanding this relationship may assist in determining a range of suitable flow rates for a wafer comb. For example, the inventor discovered that when fluid velocities and nozzle diameters are varied, the energy requirements for the nozzle pump are approximately the same. In other words, the product of mass and velocity remained constant over the range of nozzle diameters examined for the following three conditions: (1) no cleaning, (2) good cleaning and (3) wafer damage. Therefore, the total energy of the working fluid determined which condition was met for a particular wafer comb.

For a given wafer comb, there is a maximum amount of energy that the wafers can tolerate in a fluid flowing across their surfaces before flutter, vibration and twist will be induced, which, if unchecked, will lead to damage in a relatively short time period. Correspondingly, there is a minimum amount of energy in the working fluid that, through viscous and frictional forces, can effectively wash and carry away the slurry residue and/or fine silicon dust from the interstitial regions in a desired time period (e.g., between 0.5 to 4 hours). These circumstances provide upper and lower limits on the suitable energy of the working fluid for which wafers are neither damaged over the course of long exposure (3-4 hours or more) nor remain dirty after a short exposure (15 minutes to 2 hours or 30 minutes to 2 hours).

As described in representative embodiments, one or more streams of fluid can be moved relative to a wafer comb during interstitial cleaning. The relative positions of the one or more streams of fluid and the wafer comb can be adjusted before, during, and after the cleaning process. The relative positions can be adjusted by moving the wafer comb, the one or more streams of fluid, or both, horizontally, vertically, or both. The relative motion can be accomplished by moving one or more nozzles or by moving a discharge manifold relative to a wafer comb, by moving the wafer comb, or combinations thereof. Desirable speeds for horizontal and vertical motion can depend on wafer size, wafer thickness, wafer type, fluid velocity, flow rate, fluid temperature, and slurry composition, for example.

As stated above, in order for all the interstitial regions of the wafer comb to be cleaned, regions of expanded and compressed wafers are desirably moved along the side of the wafer comb such that all wafers experience interstitial cleaning. This can be accomplished by movement of one or more streams of fluid relative to the wafer comb, along a side of the wafer comb. Such movement along a side of the wafer comb is referred to herein as lateral movement. FIG. 2 illustrates regions of expanded wafers generated by flow regions 240, 242. Lateral movement of the flow regions 240, 242 along the wafer comb 200 is indicated by arrows 241, 243, respectively. The arrows 241, 243, indicate that lateral movement is parallel to the longitudinal axis 234 of the beam 230. It is generally desirable that during such motion, a separation between the wafer comb and the nozzles (e.g., the horizontal position of the second ends of the nozzles relative to the wafer comb) remains constant.

For embodiments in which several streams of fluid are produced and equally spaced along a side of the wafer comb, it is generally desirable to move the streams of fluid laterally along the side of the wafer comb by a lateral displacement that is equal to the separation between the streams of fluid. For example, a desirable lateral displacement is indicated in FIG. 2 by the arrow 270, which is the separation between the flow regions 240, 242. However, the relative lateral motion can also be greater than or less than the separation. For example, the lateral motion of several nozzles relative to a wafer comb is typically over a lateral displacement of between 1 and 5 times the nozzle separation, such as between 1 and 2 times the nozzle separation. The minimum lateral displacement is equal to the nozzle separation distance minus 1 nozzle diameter. Less lateral displacement may result in insufficient coverage to insure all wafers are eventually separated.

The relative lateral movement of the streams of fluid and the wafer comb can be implemented as reciprocating motion. During reciprocating motion, a predetermined lateral displacement is executed repeatedly such that a same starting location is returned to after each cycle of motion. As used herein, a cycle of lateral movement refers to one cycle of reciprocating lateral motion. For example, in FIG. 2 a cycle of lateral motion would include moving the flow region 240 by the indicated lateral displacement 270 such that it is located where the flow region 242 used to be, then moving the flow region 240 by the indicated lateral displacement 270 back to the illustrated location. In one example, a nozzle manifold comprising several nozzles having center to center separations of 2 inches is moved (while fluid is being discharged from the nozzles) laterally forward by 2 inches and then laterally backwards by 2 inches for each 180 second long interstitial cleaning cycle.

Although a faster lateral travel speed may be desirable when it shortens the length of a cleaning cycle, the lateral travel speed must also be slow enough to provide sufficient cleaning of interstitial regions. Therefore, a desirable travel speed may be the maximum allowable speed that will still ensure that each pair of wafers receiving the fluid stream will individually separate as the fluid stream moves laterally along the wafer comb. Movement of the flow regions along the wafer comb causes previously compressed wafers to become expanded and previously expanded wafers to become compressed. The speed of lateral movement is therefore desirably slow enough such that all pairs of wafers are expanded.

In general, travel speeds that are slower than $1/50^{th}$ of an inch per second, while achieving sufficient and consistent wafer spreading and cleaning, may waste valuable process time. Lateral travel speeds can be between $1/4$ an inch per second and $1/50^{th}$ of an inch per second, such as between $1/8$ an inch per second and $1/40^{th}$ of an inch per second, or between $1/10$ of an inch per second and $1/30^{th}$ of an inch per second. Desirably, the lateral speed is between $1/16^{th}$ and $1/20^{th}$ of an inch per second.

Although the lateral motion is desirably linear (i.e., parallel to the longitudinal axis of the beam) and of a constant speed so that all wafers experience the same or similar amount of cleaning, lateral motion can be sinusoidal and include acceleration in some embodiments.

Changes in slurry composition and in wafer size, thickness, or type may require parameters of the cleaning process to be changed to ensure suitable interstitial cleaning of the wafer comb. For example, wafer susceptibility to damage depends on the wafer size, thickness, and type; therefore, a suitable range of flow rates, fluid velocities, and speed of lateral motion, for example, may need to be adjusted to ensure wafer damage does not occur and that each interstitial region is expanded and sufficiently cleaned. If flow rate or fluid velocity is changed, it may also be desirable to change the duration of a cleaning cycle or to reduce the speed of lateral motion. For example, the duration of the cycle could be increased from 180 seconds to 360 seconds.

Additionally, slurry composition can affect how strongly abrasive particles and silicon fines adhere to the wafer surfaces, such that increasing the hydrophobicity and/or viscosity of the slurry may increase the range of suitable flow rates.

In general, if slurry composition is changed such that the slurry becomes more viscous or hydrophobic, it may be advantageous to increase the flow rate such as by increasing the fluid velocity. When more viscous slurry is used, it can be advantageous to increase the temperature of the cleaning fluid because viscosity tends to fall as temperature increases. The temperature preferably is not increased so high to detach wafers prematurely from the beam.

When wafer size, thickness, type or slurry composition is changed, a new suitable range of flow rates or fluid velocities can be determined through direct observation of the wafers before, during, and after the cleaning process. For example, a clear tank can be employed to facilitate observation of wafers during the cleaning process. In this manner, fluid velocity can be altered until interstitial cleaning through the creation of expanded and compressed groups of wafers is observed without causing wafer damage. Specifically, for a pre-selected nozzle size, a low fluid velocity (e.g., less than 0.5 feet per second) can be employed initially. At such a low fluid velocity, the wafers of the wafer comb will likely experience no expansion. The fluid velocity can then be increased, and the wafers will eventually reach an equilibrium state of expansion. Increasing the velocity further will cause the wafers to twist and tear free from the beam, or to collide, ultimately resulting in wafer damage. Before wafers tear free from the beam, they tend to shutter or vibrate. The velocity at which wafers break free from the beam is also dependent on properties of the adhesive used to mount the ingot to the beam. In this manner, a range of suitable fluid velocities between no expansion and wafer damage are determined through observation.

A fluid velocity may be considered too low if wafers take too long to clean or if surfaces do not come completely clean. A reasonable duration for the cleaning process for the presently disclosed method and apparatus embodiments is generally between 0.5 and 4 hours, such as between 1 and 2 hours, or less than 1 hour, or less than 1.3 hours, or less than 1.5 hours, or less than 2 hours. If the cleaning process takes longer than 8 hours, such as 24 hours, wafer staining may occur. Therefore, if the cleaning process takes longer than an established reasonable time, it may be desirable to increase the fluid velocity within the suitable range.

Once a suitable range of fluid velocities is determined, a suitable speed of lateral motion can be determined such that all wafers experience expansion as fluid flow moves laterally along a side of the wafer comb.

Without being limited to any particular theory, interstitial cleaning can be performed by establishing a flow pattern including regions of forward flow and non-flow that alternates along a side of a wafer comb. For example, regions of streamlined flow can be produced with regions of stagnant or eddying flow between them. When wafers of the wafer comb are adjacent to a region of streamlined flow, they separate and form groups of expanded wafers. As a result, the fluid can flow between the separated wafers more effectively than if the wafers were not expanded or only separated by the kerf distance. The surrounding wafers on either side of these regions of streamlined flow are compressed together to be separated by less than the kerf distance. Wafers in the stagnant or eddying regions may experience backflow that would, if the wafers were to prematurely release from the beam, tend to pull them out of the comb and into the space between the nozzles, where they would be broken by shearing action as the nozzles move past them.

Representative methods of operation described herein can include pressurizing the fluid before it is discharged. In general, the pressure of the fluid is indicative of the fluid velocity at discharge. In embodiments described herein, the fluid is typically pressurized to a pressure between 0.001 psig and 10.0 psig, such as between 0.01 psig and 5.0 psig. Desirably, the fluid is pressurized to a pressure between 0.01 psig and 0.2 psig, between 0.2 psig and 0.4 psig, between 0.4 psig and 0.8 psig, between 0.8 psig and 1.2 psig, between 1.2 psig and 1.4 psig, or between 1.4 psig and 2 psig. An advantageous operating pressure in certain embodiments is between 1 psig and 1.2 psig, such as 1.10 psig. In some embodiments, the fluid is pressurized by pumping the fluid at a particular rate into a chamber of a discharge manifold. In certain embodiments, the fluid in the chamber of the discharge manifold is pressurized such that the nozzles exhibit the same pressure drop regardless of a position along the length of a discharge manifold. The nozzle pressure can be maintained and regulated such as through a closed-feedback circulation loop, comprising in one example, a centrifugal pump, three-phase motor and variable-frequency motor drive which can be capable of producing a user-selectable nozzle pressure.

Representative embodiments can include moving one or more streams of fluid vertically relative to a wafer comb, moving the wafer comb vertically relative to the streams of fluid, or both. Such movements are referred to as relative vertical motion between the streams of fluid and the wafer comb. FIG. 2 illustrates regions of expanded wafers generated by flow regions 240, 242. Vertical movement of the flow regions 240, 242 along the wafer comb 200 is indicated by arrows 244, 245, respectively. The arrows 244, 245, indicate that vertical movement is perpendicular to the longitudinal axis 234 of the beam 230. In some embodiments, it is desirable to adjust the relative vertical position of the wafer comb and the streams of fluid during the cleaning process because such motions can decrease the duration of the cleaning process. However, in some embodiments, a relative vertical position is constant during the cleaning process.

In some embodiments, a cleaning process or cycle begins with the nozzles at a first vertical position that is close to the top of the wafers. For example, the first vertical position can be less than 30% of the wafer height from the top of the wafers. During the cleaning process, the relative position of the wafer comb and the nozzles is moved to a last vertical position that is closer to the bottom of the wafers. For example, the last vertical position can be greater than 30% of the wafer height from the top of the wafers. The relative vertical position of the wafer comb and the stream of fluid can be continuously adjusted during the cleaning cycle or the adjustment can be incremental. Furthermore, the vertical position can be adjusted to correspond to one or more vertical positions intermediate the first and the last vertical positions. In general, relative vertical motion can be between any vertical positions described herein.

Although purely lateral motion can be advantageous during portions of the cleaning cycle, in certain embodiments, lateral and vertical motion can be performed simultaneously or sequentially. In such embodiments, it can be desirable to maintain a lateral component of motion that is constant. In some embodiments, lateral and vertical motion can be coordinated. For example, a vertical position can be adjusted such that each cycle or half cycle of lateral motion is performed at a predetermined vertical position. However, in some embodiments, the lateral and vertical motion is not coordinated and vertical positions are adjusted during the cycle, before a cycle or half cycle of lateral motion is completed.

In one example of coordinated lateral and vertical motion, the relative vertical position of one or more nozzles relative to the wafer comb is adjusted to be a first relative vertical position that is at the top of the wafers, or at 0% of the wafer height from the top of the wafers. A first half of a cycle of lateral motion is performed and then the nozzles and/or the wafer comb are moved to a second relative vertical position that is between 10% and 20% of the wafer height from the top of the wafers. A second half of the cycle of lateral motion is then performed. Additionally, the nozzles and/or the wafer comb can then be moved to a third relative vertical position that is between 25% and 35% of the wafer height from the top of the wafers for a third half cycle of lateral motion.

Representative embodiments described herein can include submerging the wafers of the wafer comb in a fluid. As referred to herein, submerging of the wafers includes contacting the wafers of the wafer comb with fluid such that most or all of the wafers are simultaneously contacted on both surfaces and along their entire height with the fluid. For example, for a wafer comb in the wafers down orientation, submerging the wafer comb includes placing the wafer comb in a tank of fluid such that the level of the fluid is at least as high as the top edges of the wafers, or placing the wafer comb in a tank and then filling the tank with fluid at least until the fluid level reaches the top edges of the wafers. The wafers of the wafer comb can be submerged in a fluid before, during, and/or after the described methods are performed. The nozzles producing the streams of fluid are typically also submerged when the wafers of the wafer comb are submerged. Wafers can be partially submerged. That is, the wafers can be contacted with fluid such that a portion of the wafers of the wafer comb, or such that a portion of each of the wafers, is not submerged. However, partially submerging the wafers of the wafer comb is generally not as desirable as completely submerging the wafers.

In some embodiments, submerging the wafers facilitates interstitial cleaning. Without being bound to any particular theory, it is currently hypothesized that by submerging the wafers the air-fluid interface that exists when a wafer comb is suspended in air and sprayed is removed. This is advantageous because, in the un-submerged condition, as fluid flows between wafers that are not submerged, gravity pulls much of the fluid downward and out from between the wafers creating strong surface tension forces. These forces draw the wafers together making it very difficult to flow water between the wafers, and ultimately to clean the interstitial regions of the wafer comb. When wafers are submerged in a fluid, the surface tension forces associated with the air-water interface are eliminated and thus the forces pulling the wafers together are also eliminated or greatly reduced. Therefore, the wafers can be separated and flushed with fluid using less force (e.g., using a stream of fluid having a lower velocity and therefore lower kinetic energy) than would be possible if the wafers were in air and not submerged in a fluid. This is particularly advantageous when cleaning fragile solar wafers because solar wafers become damaged when sprayed with a high-force wash. Submerging the wafers of the wafer comb therefore facilitates interstitial cleaning by allowing interstitial regions of the wafer comb to be expanded and flushed of residual slurry fluid using low-energy streams of fluid as described herein.

Representative embodiments described herein can include detaching the wafers of the wafer comb from the beam. Wafer detaching can be performed by contacting the adhesive attaching the wafers to the wafer comb with a fluid at an elevated temperature for a predetermined period of time. For example, the wafer comb can be submerged in the fluid at the elevated temperature for the predetermined period of time. Wafer detaching can also include heating the fluid to the elevated temperature. The period of time that the wafer comb is contacted with the fluid depends on properties of the adhesive and on the elevated temperature.

An elevated temperature of between 70 and 100 degrees Celsius is typically sufficient to allow the wafers to detach from the beam. For example, in some embodiments, the elevated temperature is between 75 and 99 degrees Celsius, while in other embodiments, the elevated temperature is between 80 and 95 degrees Celsius. Desirably, the elevated temperature is between 90 and 99 degrees Celsius. In a particular embodiment, the elevated temperature is 94 degrees Celsius. The predetermined period of time is typically between 1 and 60 minutes, with shorter times corresponding to higher fluid temperatures and longer times corresponding to lower fluid temperatures. For example, for an elevated temperature of 70 degrees Celsius, the period of time to detach may be 30 to 60 minutes. When the elevated temperature is between 90 and 99 degrees Celsius, the time period for detach for a typical epoxy adhesive is between 6 to 10 minutes, but can be significantly less than 6 minutes depending on the properties of the particular adhesive used. In one example, the elevated temperature was 94 degrees Celsius and the period of time for detach was 6 minutes.

Figure 19:
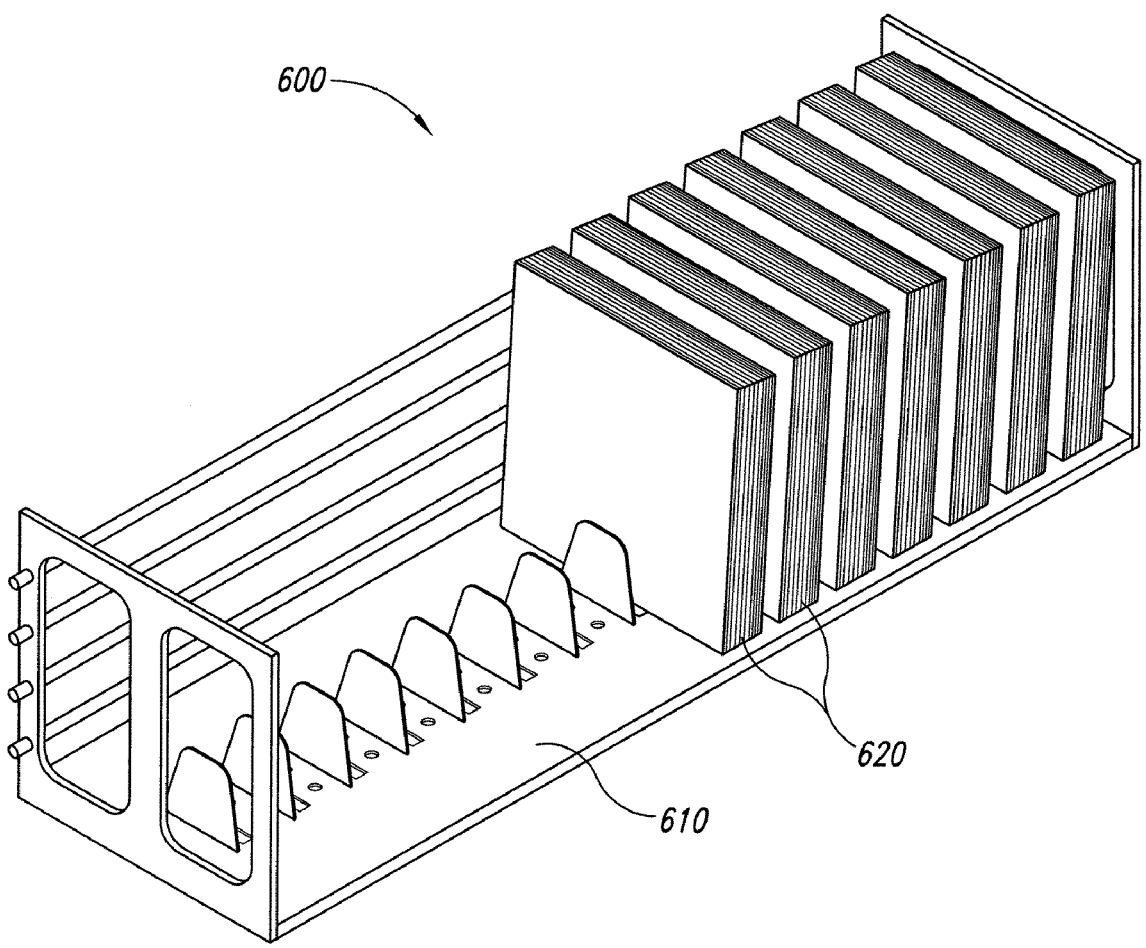
FIG. 19 is an illustration of clean wafers in a cassette after detachment from a beam.

When the wafers are detached from the beam, the wafers can be released from the beam into a wafer cage connected to the wafer comb or to the beam. For example, the wafer cage can be mounted to the wafer comb such that the wafers fall a distance of between $1/16$ and $1/4$ of an inch, and desirably $1/8$ of an inch, into the wafer cage. FIG. 19 is an illustration of clean wafers 620 in a wafer cage 610 after the wafers have been detached from the beam.

The fluid used for detaching the wafers can be pumped from a holding tank as described herein. The fluid can also be re-used for detaching wafers of several wafer combs. For example, the detach fluid can be pumped back to the holding tank after the wafers have detached from the beam. In this manner, the heat content of the detach fluid can be conserved. The detach fluid may be filtered while being pumped to the holding tank. Typically, the detach fluid is de-ionized water, though other fluids described herein can be used. Certain epoxies may require the use of an aqueous acidic solution to cause release. In this instance, solutions of acetic acid, citric acid, or other acids may be used.

Representative methods of operation can include performing a pre-wash cycle. The pre-wash cycle can include spraying the wafer comb to provide an initial or final rinse. During the pre-wash cycle, regions of expanded and compressed wafers as described herein are not generated, particularly because the pre-wash spray is not intended to provide interstitial cleaning. For example, the pre-wash spraying can be performed from above the wafer comb and can be directed at the beam. The performing of the pre-wash cycle can include cascading water gently onto the wafer comb. It is generally desirable that the fluid used in the pre-wash cycle have a temperature between 10 degrees Celsius and 30 degrees Celsius, although the fluid can be of any temperature (e.g., between 10 and 99 degrees Celsius). The performing of the pre-wash cycle can include heating the fluid and/or pressurizing the fluid. In some examples, the fluid is pressurized to between 40 and 100 psi, such as to between 60 psi and 70 psi, between 70 psi and 80 psi, or between 80 psi and 90 psi. The fluid can be pressurized to higher pressures, though higher pressures do not generally provide better cleaning. The pre-wash spraying can be performed using pre-wash sprayers as described herein. The pre-wash spray is typically performed for between 15 seconds and 300 seconds, and desirably between 60 seconds and 200 seconds. A pre-wash cycle can be performed for more than 300 seconds when it doesn't unnecessarily lengthen the duration of the cleaning process.

Representative embodiments described herein can include receiving and transmitting information in order to control or monitor various aspects of wafer cleaning apparatus operation. For example, a controller as described herein can receive signals from various sensors and transmit signals to various components to regulate system operation based on the received signals. The regulating of system operation can be organized as one or more feedback loops, the loops typically including one or more sensors, a controller, and another system component.

In one example, a signal indicative of a fluid level in the process tank is transmitted to a controller or to a drain valve regulator. Based on the received signal, the drain can be opened, closed, or delayed for a predetermined period. This delay control can be advantageous because when a level sensor indicates that the process tank is empty, fluid likely remains within the plumbing. Therefore, when the signal or other indication that the tank is empty is transmitted from the level sensor to a controller, the controller can delay closing the valve to allow fluid retained in the plumbing to flow out.

In some embodiments, a controller receives a signal from a flow rate sensor that is indicative of a fluid flow rate and transmits signals to other system components based on received signals. For example, the controller can be coupled in a feedback loop with the flow rate sensor and a pump motor, and the fluid velocity (and therefore the flow rate) can be regulated by adjusting the frequency of the pump motor. In a specific example, the controller receives signals from a pressure transducer that are indicative of the nozzle pressure. The controller then adjusts the frequency of a variable frequency drive of a pump motor based on the received signals. In this manner, a constant pressure can be maintained across the nozzles of a discharge manifold, which yields the same fluid velocity across all the nozzles of the discharge manifold.

The controller can also be used to adjust cycle duration, fluid temperature, wafer comb position, nozzle and/or discharge manifold position, and vertical and lateral motion, for example, in addition to other process parameters described herein. Additionally, the controller can be used to perform a series of predetermined process steps as part of a cleaning cycle.

Methods of operation control described herein can be implemented by computer-executable instructions stored on one or more computer-readable media (e.g., computer readable storage media or other tangible media). Such computer-executable instruction can cause a processor to perform the described method. The one or more computer-readable media can be executed by a controller as described herein.

Representative embodiments described herein can include performing steps for cleaning out plumbing between cleaning cycles. Such steps can be advantageous for reducing the dirty fluid (e.g., fluid comprising slurry and silicon dust) that contaminates fluid used in later cleaning cycles. In this manner, the cleaning process can run more efficiently. Some embodiments include delaying the closure of a process tank drain after the tank is indicated to be empty in order to allow fluid retained in plumbing to drain out. A drain delay of at least 10 seconds, and desirably 15 seconds, is generally sufficient. Embodiments described herein can include flushing of the system with additional fluid to remove dirty fluid in the plumbing. For example, a pump may contain a reservoir that retains some dirty fluid after the fluid is drained from the system. The retained fluid in the reservoir can be quite dirty and, if not flushed out, the dirty fluid would contaminate clean water pumped into the system for the next cleaning cycle. Flushing the system for 30 to 45 seconds is generally sufficient.

Representative embodiments described herein can include heating of the fluids used during interstitial cleaning or providing the fluids at various temperatures. For example, fluids can be provided at or heated to temperatures between 8 and 99 degree Celsius. When the fluid is not intended to induce wafer detachment from the beam, temperatures of less than 50 degrees Celsius are generally preferred. A temperature above 10 degrees Celsius is generally advantageous for reducing the viscosity of the slurry. Therefore, during interstitial cleaning, fluids typically have a temperature between 10 and 50 degrees Celsius, such as between 10 and 40 degrees Celsius, or between 10 and 30 degrees Celsius. Desirably, the fluid has a temperature between 15 and 30 degrees Celsius, such as between 15 and 20 degrees Celsius, between 20 and 25 degrees Celsius, or between 25 and 30 degrees Celsius.

EXAMPLES

Figure 21:
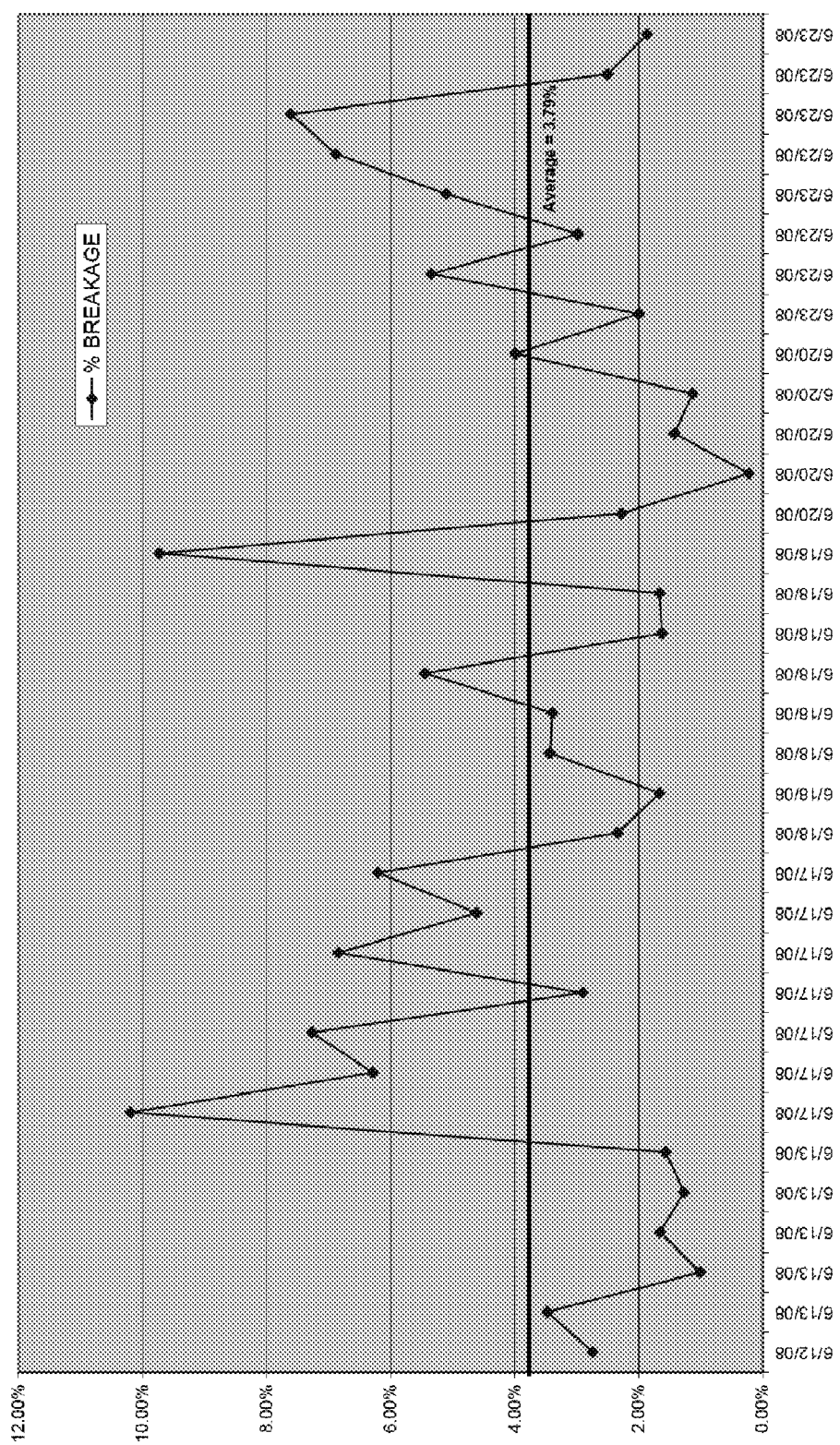
FIG. 21 illustrates solar wafer percent damage of clean solar wafers provided when using embodiments of the disclosed apparatus and methods.
Figure 22A:
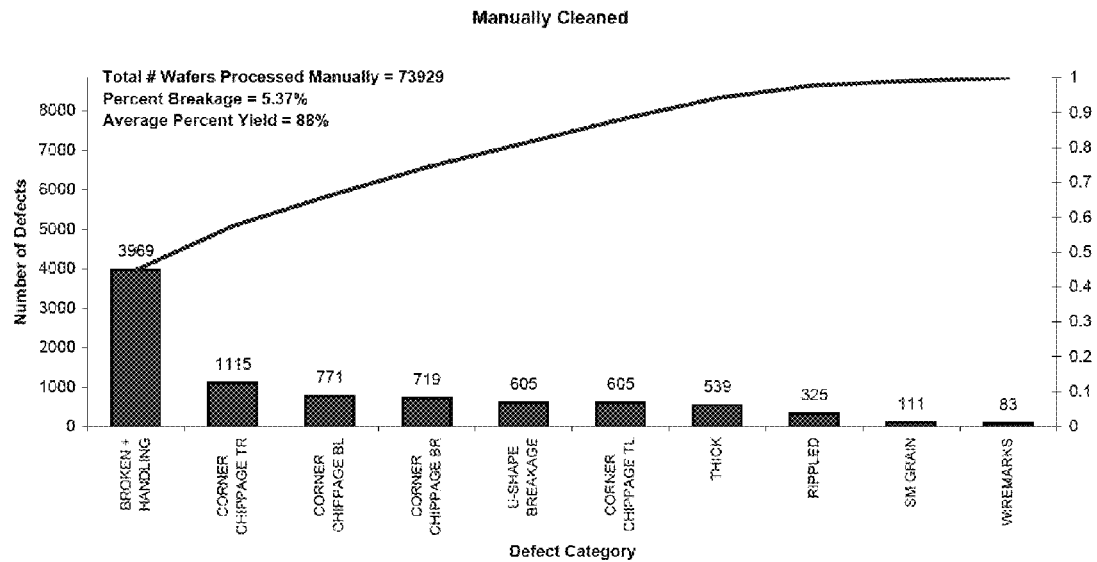
FIGS. 22A-22B illustrate solar wafer damage percent comparisons between manually cleaned solar wafers and solar wafers cleaned using embodiments of the disclosed apparatus and methods.
Figure 22B:
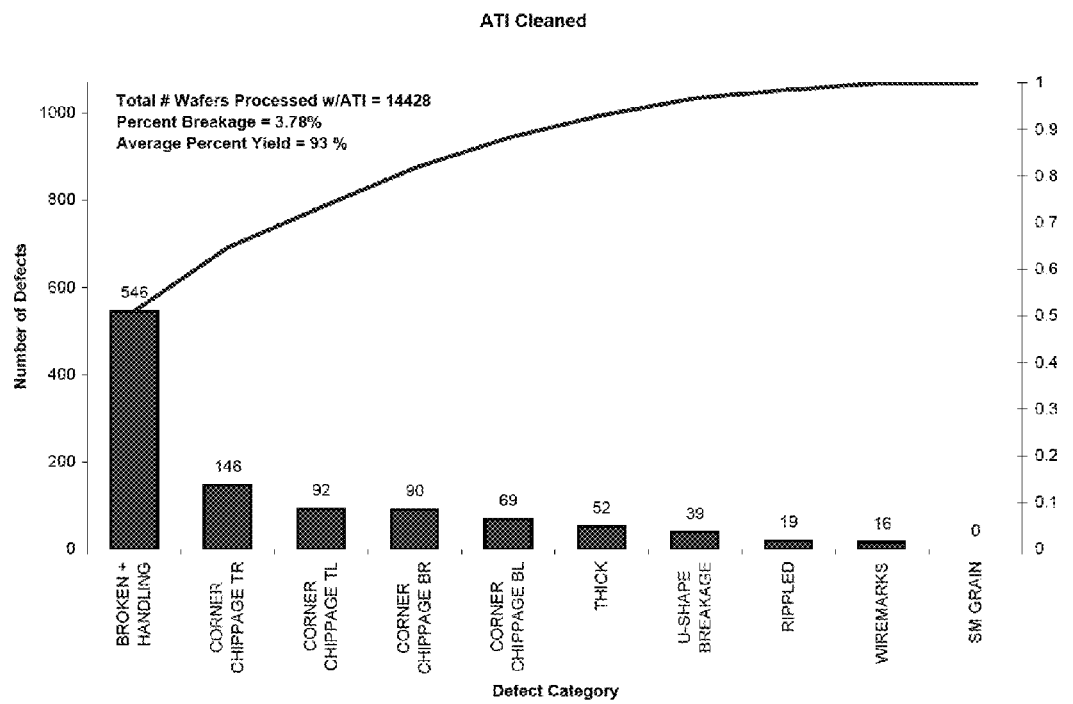

In one particular example, for nozzles having a diameter of 0.370 inches and spaced 2 inches center-to-center along a nozzle manifold, a fluid velocity of greater than 6 feet-per-second (FPS). A velocity of 8 feet-per-second, a lateral travel speed of 0.022 bar inches-per-second, and a total displacement of 2 inches provided effective cleaning of a wafer comb comprising 156 mm square polysilicon solar wafers having thicknesses of 220 microns formed from multiple ingots mounted on a single beam providing 300-400 mm total silicon length prior to wire-saw cutting. In the example, the wafers had been cut with a PEG-200 base slurry comprising SiC abrasive particles, and proprietary additives. The slurry is also known as Huntsman HS-24™. FIGS. 21-22 provide damage results of various solar wafer cleaning process and apparatus embodiments.

A first representative embodiment of a solar wafer cleaning process is presented in Table 1. In Table 1, a description of each of eight steps in the process is provided in the first column. The second column indicates a number of times each step is repeated in the process. The third column indicates the duration of each step and the fourth column provides the frequency of the pump motor supplying a discharge manifold. Prior to execution of the cleaning process, a wafer comb is positioned relative to a discharge manifold as described herein. The wafer comb and discharge manifold are typically both situated within a processing tank.

At Step 1, a wafer comb is sprayed with deionized water to perform a pre-wash or a preliminary clean. The preliminary clean can be performed using pre-wash sprayers as described herein. Desirably, the wafer comb is sprayed from above the beam. In this embodiment, the temperature of the deionized water used in Step 1 is 30 degrees Celsius and sprayers providing the pre-wash are pressurized to 65 psi. In this embodiment, the Step 1 pre-wash is performed only once for a duration of 180 seconds.

At Step 2, a wash cycle is performed using city water such as tap water. In this embodiment, each wash cycle includes a single cycle of constant lateral motion of a discharge manifold comprising several nozzles over a lateral displacement of 2 inches. Each wash cycle also includes generating several streams of fluid to be received by the wafer comb to perform interstitial cleaning as described herein. In the embodiment, the wash cycle of Step 2 is performed twice, each time for a duration of 180 seconds. Typically, the number of times the wash cycle is performed is adjustable. Therefore, the wash cycle of Step 2 can be performed more than twice or less than twice. For example, in other embodiments, the wash cycle of Step 2 may be repeated 3-6 times.

At Step 3, a wash cycle is performed using deionized water. In the embodiment, the wash cycle of Step 3 is performed once for a duration of 180 seconds. Typically, the number of times the wash cycle is performed is adjustable. Therefore, the wash cycle of Step 3 can be performed more than once or less than once (i.e., the cycle can be omitted). For example, in other embodiments, the wash cycle of Step 3 may be repeated 2-6 times. Also, the wash cycles of Step 2 may be eliminated and all wash cycles can be performed using deionized water; however, performing some wash cycles using city or tap water allows deionized water to be conserved.

At Step 4, a chemical wash cycle is performed. During the chemical wash cycle of Step 4, interstitial cleaning is performed as described herein using an alkaline surfactant such as a sodium-free alkaline surfactant comprising KOH and a detergent. In the embodiment, the chemical wash cycle is performed once for a duration of 600 seconds. The chemical wash of Step 4 may be omitted if the slurry is sufficiently removed using the deionized water wash cycles. For example, the chemical wash may be omitted if the slurry used to cut the wafers did not include additives that cannot be removed merely using deionized water wash cycles. The chemical wash of Step 4 can be repeated, though typically the cycle need not be repeated.

At Step 5, a wash cycle is performed using deionized water. In the embodiment, the wash cycle of Step 5 is performed three times, each time for a duration of 180 seconds. The wash cycle of Step 5 is generally repeated until the chemical wash fluid is sufficiently removed from the wafer comb. In the embodiment, the wash cycle of Step 5 is performed three times, each time for a duration of 180 seconds. In other embodiments, the wash cycle of Step 5 can be performed more or fewer times, and the cycle can be omitted.

At Step 6, a detach cycle is performed to remove the wafers from the wafer comb. During the detach cycle, the adhesive attaching the wafers to the beam is contacted with a fluid of an elevated temperature as described herein. In this embodiment, the detach cycle of Step 6 is performed once for a duration of 360 seconds. As described herein, the detach cycle may be shorter or longer in other embodiments, since the duration of the detach cycle depends at least partially on the type of adhesive used in the wafer comb and the temperature of the detach fluid.

At Step 7, a wash cycle is performed using deionized water. The wash cycle of Step 7 is performed to cool the wafers after the hot detach cycle of Step 6. In some embodiments, the wash cycle of Step 7 is performed more than once, while in other embodiments, the wash cycle of Step 7 is omitted.

At Step 8, a spray wash is performed using sprayers positioned above the beam. For example, the spray wash of Step 8 can be performed using pre-wash sprayers as described herein. In some embodiments, Step 8 is omitted.

After Steps 1-8 have been performed, the wafers have been provided a final clean. The process cycle illustrated in Table 1 can be performed using apparatus described herein and can be combined with methods described herein. In the embodiment, the cycle durations are representative of the lateral travel speed of the discharge manifold during the cleaning process. Therefore, for those embodiments in which a different lateral travel speed is preferred, the wash cycles may be longer or shorter in duration.

Optionally, the cleaning process represented by Table 1 can include relative vertical motion of the discharge manifold and the wafer comb. For example, the wafer comb can be positioned at the beginning of each wash cycle at a first vertical position that is at the mounted edge of the wafers (i.e., 0% of the wafer height from the top of the wafers). After 90 seconds, the wafer comb can be lowered to a second vertical position that is 15% to 20% of the wafer height from the top of the wafers. In this manner, since the "down and back" reciprocating lateral motion of the discharge manifold occurs over a 180 second cycle, the "down" motion occurs when the wafer comb is at the first vertical position, and the "back" motion occurs when the wafer comb is at the second vertical position. The wafer comb is then repositioned at the first vertical position so that the next wash cycle begins with the wafer comb at the first vertical position.

TABLE 1

| STEP | # of times STEP is repeated | Duration of STEP (sec) | PUMP Hz |
|---|---|---|---|
| STEP 1: Deionized H2O Pre-Wash Spray | Fixed @ 1x | 180 | 30.0 |
| STEP 2: City H2O Wash Cycle | 2 | 180 | 30.0 |
| STEP 3: Deionized H2O Wash Cycle | 1 | 180 | 30.0 |
| STEP 4: Chemical Wash Cycle | Fixed @ 1x | 600 | 30.0 |
| STEP 5: Deionized H2O Wash Cycle | 3 | 180 | 30.0 |
| STEP 6: Detach Cycle | Fixed @ 1x | 360 | 30.0 |
| STEP 7: Deionized H2O Wash Cycle | 1 | 180 | 30.0 |
| STEP 8: Deionized Pre-Wash Spray | Fixed @ 1x | 180 | 30.0 |
| Total Time = | | 2040 | |

A second representative embodiment of a solar wafer cleaning process is presented in Table 2. In Table 2, a step number is provided in the first column and a description of each of the steps is provided in the second column. The third column indicates the duration of each step and the fourth column provides the total process duration. Prior to execution of the process, a wafer comb is positioned relative to a discharge manifold within a process tank as described herein.

At a step 1, a spray rinse with deionized water is provided using pre-wash sprayers as described herein. During step 1, the drain of the process tank is opened to allow the deionized water and any debris rinsed from the wafer comb to drain out of the process tank. In this embodiment, the spray rinse of step 1 lasts 90 seconds.

At a step 2, the process tank is filled with city water (i.e., tap water) such that the wafers are submerged. The city water may be heated before entering the process tank. In this embodiment, it takes 123 seconds to fill the process tank sufficiently such that the wafers are submerged.

At a step 3, the city water in the process tank is recirculated through the discharge manifold to perform interstitial cleaning as described herein. For example, the city water is removed from the process tank through plumbing connected to a pump, which then pumps the water into the discharge manifold and out of the nozzles back into the process tank. In this embodiment, each recirculation step includes a single cycle of lateral displacement of the discharge manifold. In this embodiment, the recirculation and interstitial cleaning is performed for 180 seconds.

At a step 4, the process tank is drained such as by opening a drain valve at the bottom of the process tank. In this embodiment, it takes 66 seconds to drain the process tank of water.

At a step 5, the closing of the drain valve of the process tank is delayed for 15 seconds to allow dirty fluid retained in the plumbing to also flow out the drain.

At a step 6, portions of the plumbing are flushed with water to force dirty water out of any reservoirs in the pump and to flush recirculation plumbing with clean water. For example, the plumbing connecting the process tank, pump, and discharge manifold is flushed with water. In this embodiment, the pump flush is performed for 45 seconds.

At a step 7, the process tank is filled a second time with city water such that the wafers are submerged. The city water may be heated before it enters the process tank. In this embodiment, it takes 123 seconds to fill the process tank sufficiently such that the wafers are submerged.

At a step 8, the city water in the process tank is recirculated through the discharge manifold to perform interstitial cleaning as described herein. In this embodiment, the recirculation and interstitial cleaning is performed for 180 seconds.

At a step 9, the process tank is drained. In this embodiment it takes 66 seconds to drain the process tank.

At a step 10, the closing of the drain valve of the process tank is delayed for 15 seconds to allow dirty fluid retained in the plumbing to also flow out the drain.

At a step 11, portions of the plumbing are flushed with water to force dirty water out of the plumbing.

At a step 12, the process tank is filled with deionized water such that the wafers are submerged. The deionized water may be heated before it enters the process tank. The deionized water may be received from a holding tank. In this embodiment, it takes 123 seconds to fill the process tank sufficiently such that the wafers are submerged.

At a step 13, the deionized water in the process tank is recirculated through the discharge manifold to perform interstitial cleaning as described herein. In this embodiment, the recirculation and interstitial cleaning is performed for 180 seconds.

At a step 14, the process tank is drained. In this embodiment it takes 66 seconds to drain the process tank.

At a step 15, the closing of the drain valve of the process tank is delayed for 15 seconds to allow dirty fluid retained in the plumbing to also flow out the drain.

At a step 16, portions of the plumbing are flushed with water to force dirty water out of the plumbing.

After the pump flush at step 16, the process pauses so that an operator can add a chemical to the process tank.

At a step 17, the operator restarts the process after placing the chemical additive in the tank or otherwise adding the chemical to the cleaning apparatus. For example, the operator can push a button on a controller to resume the process. Otherwise, the chemical additive can be added automatically (i.e., without an operator). In this case, the pause and restart steps may not be necessary and may therefore be omitted.

At a step 18, the process tank is filled with deionized water such that the wafers are submerged in a mixture of deionized water and the chemical additive. The deionized water may be heated before entering the process tank. In this embodiment, it takes 123 seconds to fill the process tank sufficiently such that the wafers are submerged.

At a step 19, the deionized water and chemical additive solution in the process tank is then recirculated through the discharge manifold to perform interstitial cleaning as described herein. In this embodiment, the recirculation and interstitial cleaning using the deionized water and chemical additive solution is performed for 600 seconds.

At a step 20, the process tank is drained. In this embodiment, it takes 66 seconds to drain the process tank.

At a step 21, the closing of the drain valve of the process tank is delayed for 15 seconds to allow dirty fluid retained in the plumbing to also flow out the drain.

At a step 22, portions of the plumbing are flushed with water to force dirty water out of the plumbing.

At a step 23, the process tank is filled with deionized water such that the wafers are submerged. The deionized water may be heated before it enters the process tank. In this embodiment, it takes 123 seconds to fill the process tank sufficiently such that the wafers are submerged.

At a step 24, the deionized water in the process tank is recirculated through the discharge manifold to perform interstitial cleaning as described herein. In this embodiment, the recirculation and interstitial cleaning is performed for 180 seconds.

At a step 25, the process tank is drained. In this embodiment it takes 66 seconds to drain the process tank.

At a step 26, the closing of the drain valve of the process tank is delayed for 15 seconds to allow dirty fluid retained in the plumbing to also flow out the drain.

At a step 27, portions of the plumbing are flushed with water to force dirty water out of the plumbing.

At a step 28, the process tank is filled with deionized water such that the wafers are submerged. The deionized water may be heated before it enters the process tank. In this embodiment, it takes 123 seconds to fill the process tank sufficiently such that the wafers are submerged.

At a step 29, the deionized water in the process tank is recirculated through the discharge manifold to perform interstitial cleaning as described herein. In this embodiment, the recirculation and interstitial cleaning is performed for 180 seconds.

At a step 30, the process tank is drained. In this embodiment it takes 66 seconds to drain the process tank.

At a step 31, the closing of the drain valve of the process tank is delayed for 15 seconds to allow dirty fluid retained in the plumbing to also flow out the drain.

At a step 32, portions of the plumbing are flushed with water to force dirty water out of the plumbing.

At a step 33, the process tank is filled with deionized water such that the wafers are submerged. The deionized water may be heated before it enters the process tank. In this embodiment, it takes 123 seconds to fill the process tank sufficiently such that the wafers are submerged.

At a step 34, the deionized water in the process tank is recirculated through the discharge manifold to perform interstitial cleaning as described herein. In this embodiment, the recirculation and interstitial cleaning is performed for 180 seconds.

At a step 35, the process tank is drained. In this embodiment it takes 66 seconds to drain the process tank.

At a step 36, the closing of the drain valve of the process tank is delayed for 15 seconds to allow dirty fluid retained in the plumbing to also flow out the drain.

At a step 37, portions of the plumbing are flushed with water to force dirty water out of the plumbing.

At a step 38, the process tank is filled with a hot detach fluid such that the wafers are submerged. The hot detach fluid can be received from a holding tank connected to the process tank. In this embodiment, it takes 110 seconds to fill the process tank sufficiently such that the wafers are submerged.

At a step 39, the hot detach fluid in the process tank is recirculated through the discharge manifold as described herein. In this embodiment, the hot detach fluid is recirculated for 360 seconds.

At a step 40, the hot detach fluid is transferred out of the process tank. For example, the hot detach fluid can be drained or it can be transferred to a holding tank. In this embodiment, it takes 95 seconds to transfer the hot detach fluid out of the process tank. At this point, the wafers will have been detached from the beam and will be resting in a wafer cage.

At a step 41, the process tank is filled with deionized water such that the wafers are submerged. In this embodiment, it takes 123 second to fill the process tank sufficiently such that the wafers are submerged.

At a step 42, the deionized water in the process tank is recirculated through the discharge manifold. In this embodiment, the recirculation is performed for 90 seconds.

At a step 43, the process tank is drained. In this embodiment it takes 66 seconds to drain the process tank.

At a step 44, the closing of the drain valve of the process tank is delayed for 15 seconds to allow dirty fluid retained in the plumbing to also flow out the drain.

At a step 45, a final spray rinse is performed using deionized water by the pre-wash sprayers described herein. Then the drain is opened to drain the process tank.

The process illustrated in Table 2 can be performed using apparatus described herein and can be combined with methods described herein. In the embodiment, the cycle durations can be representative of the lateral travel speed of the discharge manifold during the cleaning process. Therefore, for those embodiments in which a different lateral travel speed is preferred, the wash cycles may be longer or shorter in duration. Furthermore, the embodiment can optionally include relative vertical motion of the discharge manifold and the wafer comb.

TABLE 2

| STEP # | STEP - Description | Duration (sec) | Total Cycle Time |
|---|---|---|---|
| 1 | Deionized Water Spray Rinse - Drain Open | 90 | 0:01:30 |
| 2 | City Water Fill #1 | 123 | 0:03:33 |
| 3 | City Water Recirculate | 180 | 0:06:33 |
| 4 | Drain | 66 | 0:07:39 |
| 5 | Drain Delay - 15 sec | 15 | 0:07:54 |
| 6 | Pump Flush - 45 sec | 45 | 0:08:39 |
| 7 | City Water Fill #2 | 123 | 0:10:42 |
| 8 | City Water Recirculate | 180 | 0:13:42 |
| 9 | Drain | 66 | 0:14:48 |
| 10 | Drain Delay - 15 sec | 15 | 0:15:03 |
| 11 | Pump Flush - 45 sec | 45 | 0:15:48 |
| 12 | Deionized Water Fill #1-A | 123 | 0:17:51 |
| 13 | Deionized Water Recirculate | 180 | 0:20:51 |
| 14 | Drain | 66 | 0:21:57 |
| 15 | Drain Delay - 15 sec | 15 | 0:22:12 |
| 16 | Pump Flush - 45 sec [PAUSED] | 45 | 0:22:57 |
| 17 | RESTART initiated by Operator, Confirms Chemical Addition | 0 | 0:22:57 |

TABLE 2-continued

| STEP # | STEP - Description | Duration (sec) | Total Cycle Time |
|---|---|---|---|
| 18 | Deionized Water Fill - Post Chemical Addition | 123 | 0:25:00 |
| 19 | Chemical Clean Recirculate | 600 | 0:35:00 |
| 20 | Drain | 66 | 0:36:06 |
| 21 | Drain Delay - 15 sec | 15 | 0:36:21 |
| 22 | Pump Flush - 45 sec | 45 | 0:37:06 |
| 23 | Deionized Water Fill #1-B | 123 | 0:39:09 |
| 24 | Deionized Water Recirculate | 180 | 0:42:09 |
| 25 | Drain | 66 | 0:43:15 |
| 26 | Drain Delay - 15 sec | 15 | 0:43:30 |
| 27 | Pump Flush - 45 sec | 45 | 0:44:15 |
| 28 | Deionized Water Fill #2 | 123 | 0:46:18 |
| 29 | Deionized Water Recirculate | 180 | 0:49:18 |
| 30 | Drain | 66 | 0:50:24 |
| 31 | Drain Delay - 15 sec | 15 | 0:50:39 |
| 32 | Pump Flush - 45 sec | 45 | 0:51:24 |
| 33 | Deionized Water Fill #3 | 123 | 0:53:27 |
| 34 | Deionized Water Recirculate | 180 | 0:56:27 |
| 35 | Drain | 66 | 0:57:33 |
| 36 | Drain Delay - 15 sec | 15 | 0:57:48 |
| 37 | Pump Flush - 45 sec | 45 | 0:58:33 |
| 38 | Hot Detach Fluid Transfer - In | 110 | 1:00:23 |
| 39 | Hot Detach Fluid Recirculate | 360 | 1:06:23 |
| 40 | Hot Detach Fluid Transfer - Out | 95 | 1:07:58 |
| 41 | Deionized Water Fill #1-C | 123 | 1:10:01 |
| 42 | Deionized Water Recirculate | 90 | 1:11:31 |
| 43 | Drain | 66 | 1:12:37 |
| 44 | Drain Delay - 15 sec | 15 | 1:12:52 |
| 45 | Deionized Spray Rinse - Drain Open - DONE | 90 | 1:14:22 |

In view of the many possible embodiments to which the principles of this disclosure may be applied, it should be recognized that the illustrated embodiments are only representative embodiments and should not be taken as limiting the scope. Rather, the scope is defined by the following claims. We therefore claim all that comes within the scope and spirit of these claims.

I claim:

1. A method comprising:
providing final clean solar wafers by receiving a solar wafer comb having a plurality of solar wafers attached to a beam, the solar wafers having thicknesses of equal to or less than 200 μms;
submerging the solar wafer comb in a fluid bath; and
sequentially expanding interstitial regions of the solar wafer comb by directing a fluid flow through only one side of the wafer comb while the wafer comb is submerged, thereby providing the final clean solar wafers while on the beam.

2. The method of claim 1, wherein the directing a fluid flow through only one side of the wafer comb comprises generating a plurality of spaced apart streams of fluid to be received by and perpendicular to the one side of the solar wafer comb.

3. The method of claim 2, further comprising moving the plurality of spaced apart streams of fluid along the side of the solar wafer comb.

4. The method of claim 1, further comprising increasing interstitial regions of the solar wafer comb for a first group of solar wafers while decreasing interstitial regions of the solar wafer comb for a second group of solar wafers adjacent to the first group.

5. The method of claim 1, further comprising detaching the solar wafers from the beam after the solar wafers are clean.

6. The method of claim 1, wherein the solar wafer comb is pre-cleaned prior to submerging the solar wafer comb.

7. The method of claim 1, wherein not more than 20% of the clean solar wafers exhibit visible wafer damage.

8. The method of claim 1, further comprising producing a solar cell or a photovoltaic device using one or more of the solar wafers.

9. The method of claim 1, further comprising producing the solar wafer comb by cutting an ingot, mounted to the beam, using a wire-saw device.

10. The method of claim 1, wherein one or more of the solar wafers have thicknesses of 150 microns or less.

11. A method for cleaning solar wafers, comprising:
submerging in a fluid bath a central solar wafer and a first and a second solar wafer both immediately adjacent the central solar wafer, wherein each wafer is less than or equal to 200 μms in thickness and each is adhered to a beam at a respective top edge as part of a solar wafer comb;
flowing fluid while submerged, from only one side of the wafer comb, between the central solar wafer and the first solar wafer to increase a separation between the surfaces of the central and the first solar wafer;
removing slurry from the surfaces of the central and the first solar wafer using the flowing fluid; and
adjusting a position of the flowing fluid to decrease the separation between the surfaces of the central and the first solar wafer and to increase a separation between the surfaces of the central and the second solar wafer.

12. The method of claim 11, further comprising, after the wafers have been cleaned using the flowing fluid, submerging the wafers in a fluid having an elevated temperature to detach the wafers from the beam.

13. The method of claim 12, wherein the flowing fluid is moving along only one side of the solar wafer comb in a linear direction to flow fluid between immediately adjacent solar wafers as the flowing fluid is moved in a linear direction.

14. The method of claim 11, further comprising repeating the recited method acts on additional solar wafers of the solar wafer comb.

\* \* \* \* \*